(12) United States Patent
Kang et al.

(10) Patent No.: US 12,300,155 B2
(45) Date of Patent: May 13, 2025

(54) DISPLAY PANEL

(71) Applicant: Samsung Display Co., Ltd., Yongin-si (KR)

(72) Inventors: Ki Nyeng Kang, Yongin-si (KR); Guanghai Jin, Yongin-si (KR); Sunkwang Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/330,543

(22) Filed: Jun. 7, 2023

(65) Prior Publication Data

US 2024/0062709 A1 Feb. 22, 2024

(30) Foreign Application Priority Data

Aug. 22, 2022 (KR) .......................... 10-2022-0105028

(51) Int. Cl.
*G09G 3/32* (2016.01)

(52) U.S. Cl.
CPC ....... *G09G 3/32* (2013.01); *G09G 2300/0426* (2013.01); *G09G 2310/0267* (2013.01)

(58) Field of Classification Search
USPC .......................................................... 345/55
See application file for complete search history.

(56) References Cited

U.S. PATENT DOCUMENTS

| | | | |
|---|---|---|---|
| 10,147,777 B2 | 12/2018 | Lim et al. | |
| 10,672,342 B2 * | 6/2020 | Kim | H10K 59/1213 |
| 10,957,755 B2 * | 3/2021 | Han | G09G 3/20 |
| 2007/0035485 A1 * | 2/2007 | Yoon | G09G 3/3208 |
| | | | 345/76 |
| 2013/0334543 A1 * | 12/2013 | Kim | H01L 33/005 |
| | | | 257/79 |
| 2014/0078123 A1 * | 3/2014 | Park | G02F 1/13454 |
| | | | 345/205 |
| 2014/0118221 A1 * | 5/2014 | Park | G09G 3/20 |
| | | | 345/1.3 |
| 2016/0086549 A1 * | 3/2016 | Eom | G06F 3/1423 |
| | | | 345/690 |
| 2017/0061882 A1 * | 3/2017 | An | G09G 3/3266 |
| 2017/0061888 A1 * | 3/2017 | Nam | G09G 3/3266 |
| 2017/0316735 A1 * | 11/2017 | Ohara | G09G 3/3291 |
| 2018/0047799 A1 * | 2/2018 | Lim | H10K 59/88 |
| 2020/0357875 A1 * | 11/2020 | Wang | H10K 59/131 |

(Continued)

FOREIGN PATENT DOCUMENTS

| | | |
|---|---|---|
| CN | 113675254 | 11/2021 |
| KR | 10-2018-0018960 | 2/2018 |

(Continued)

*Primary Examiner* — Amy Onyekaba
(74) *Attorney, Agent, or Firm* — KILE PARK REED & HOUTTEMAN PLLC

(57) ABSTRACT

A display panel includes a base layer, a circuit layer disposed on the base layer and including a first driving circuit, a second driving circuit, and a plurality of pixel circuits, and a light emitting element layer disposed on the circuit layer and including a plurality of light emitting elements, each of the plurality of light emitting elements electrically connected to corresponding one of the plurality of pixel circuits. In a first direction, each of the first driving circuit and the second driving circuit is disposed between the plurality of pixel circuits.

20 Claims, 11 Drawing Sheets

(56) References Cited

U.S. PATENT DOCUMENTS

| | | | |
|---|---|---|---|
| 2022/0254853 A1* | 8/2022 | Kim | H10K 59/352 |
| 2023/0040741 A1* | 2/2023 | Cha | H01L 33/24 |
| 2023/0215365 A1* | 7/2023 | Lee | G06F 21/32 |
| | | | 345/204 |
| 2023/0351957 A1* | 11/2023 | Chen | G09G 3/3233 |
| 2024/0215366 A1* | 6/2024 | Liu | G09G 3/3233 |

FOREIGN PATENT DOCUMENTS

| | | |
|---|---|---|
| KR | 10-1878189 | 7/2018 |
| KR | 10-2019-0010052 | 1/2019 |

* cited by examiner

DISPLAY PANEL

CROSS-REFERENCE TO RELATED APPLICATION(S)

This application claims priority to and benefits of Korean Patent Application No. 10-2022-0105028 under 35 U.S.C. § 119, filed on Oct. 21, 2022, in the Korean Intellectual Property Office (KIPO), the entire contents of which are incorporated herein by reference.

BACKGROUND

1. Technical Field

The disclosure herein relates to a display panel with improved display quality and with an expanded display region.

2. Description of the Related Art

Multimedia electronic devices such as televisions, mobile phones, tablets, computers, navigation system units, and game consoles are equipped with a display panel for displaying images.

The display panel includes a light emitting element and a circuit for driving the light emitting element. The light emitting elements in the display panel emits light and generates image according to a voltage applied from the circuit. In order to improve the reliability of the display panel, research is underway on the connection of the light emitting element and the circuit.

SUMMARY

The disclosure provides a display panel with improved display quality and a narrow bezel.

According to an embodiment of the disclosure, a display panel may include a base layer, a circuit layer disposed on the base layer and including a first driving circuit, a second driving circuit, and a plurality of pixel circuits, and a light emitting element layer disposed on the circuit layer and including a plurality of light emitting elements, each of the plurality of light emitting elements electrically connected to corresponding one of the plurality of pixel circuits. Each of the first driving circuit and the second driving circuit may be disposed between the plurality of pixel circuits in a first direction.

In an embodiment, the first driving circuit may be a scan driving circuit, and the second driving circuit may be an emission control driving circuit.

In an embodiment, the plurality of light emitting elements may include a first light emitting element group overlapping the first driving circuit and the second driving circuit in a plan view and a second light emitting element group overlapping the plurality of pixel circuits in a plan view.

In an embodiment, each of the plurality of light emitting elements in the first light emitting element group may be electrically connected to adjacent one of the plurality of pixel circuits through a connection line.

In an embodiment, each of the plurality of light emitting elements in the first light emitting element group may include a first electrode disposed on the circuit layer, a light emitting layer disposed on the first electrode, and a second electrode disposed on the light emitting layer. The first electrode may be electrically connected to the connection line.

In an embodiment, each of the plurality of pixel circuits may be electrically connected to the first driving circuit and the second driving circuit.

In an embodiment, the circuit layer may further include a third driving circuit spaced apart from the first driving circuit and the second driving circuit. The second driving circuit may be interposed between the first driving circuit and the third driving circuit in the first direction.

In an embodiment, each of the plurality of pixel circuits may be electrically connected to the second driving circuit and closer one of the first driving circuit and the third driving circuit.

In an embodiment, the plurality of light emitting elements may include a first light emitting element group overlapping the first driving circuit, the second driving circuit, and the third driving circuit in a plan view and a second light emitting element group overlapping the plurality of pixel circuits in a plan view. Each of the plurality of light emitting elements in the first light emitting element group may be electrically connected to adjacent one of the plurality of pixel circuits through a connection line.

In an embodiment, the circuit layer may further include a fourth driving circuit disposed between the second driving circuit and the third driving circuit in the first direction.

In an embodiment, each of the plurality of pixel circuits may be electrically connected to closer one of the first driving circuit and the third driving circuit and to closer one of the second driving circuit and the fourth driving circuit.

In an embodiment, the plurality of light emitting elements may include a first light emitting element group overlapping the first driving circuit, the second driving circuit, the third driving circuit, and the fourth driving circuit in a plan view and a second light emitting element group overlapping the plurality of pixel circuits in a plan view. Each of the plurality of light emitting elements in the first light emitting element group may be electrically connected to adjacent one of the plurality of pixel circuits through a connection line.

In an embodiment, each of the first driving circuit and the second driving circuit may extend in a second direction intersecting the first direction.

According to an embodiment of the disclosure, a display panel may include a base layer including a display region and a non-display region disposed adjacent to the display region, a circuit layer disposed on the base layer and including a first driving circuit disposed in the display region, a second driving circuit spaced apart from the first driving circuit in a first direction, and a plurality of pixel circuits, and a light emitting element layer disposed on the circuit layer and including a plurality of light emitting elements disposed in the display region, each of the plurality of light emitting elements electrically connected to corresponding one of the plurality of pixel circuits. In the first direction, at least one of the plurality of pixel circuits may be disposed between the first driving circuit and the second driving circuit.

In an embodiment, each of the plurality of pixel circuits may be electrically connected to the first driving circuit and the second driving circuit.

In an embodiment, the plurality of light emitting elements may include a first light emitting element group overlapping the first driving circuit and the second driving circuit in a plan view and a second light emitting element group overlapping the plurality of pixel circuits in a plan view. Each of the plurality of light emitting elements in the first light emitting element group may be electrically connected to adjacent one of the plurality of pixel circuits through a connection line.

In an embodiment, the circuit layer may further include a third driving circuit spaced apart from the first driving circuit and the second driving circuit. The second driving circuit is interposed between the first driving circuit and the third driving circuit in the first direction. Each of the plurality of pixel circuits may be electrically connected to the second driving circuit and closer one of the first and third driving circuits.

In an embodiment, the plurality of light emitting elements may include a first light emitting element group overlapping the first driving circuit, the second driving circuit, and the third driving circuit in a plan view and a second light emitting element group overlapping the plurality of pixel circuits in a plan view. Each of the plurality of light emitting elements in the first light emitting element group may be electrically connected to adjacent one of the plurality of pixel circuits through a connection line.

In an embodiment, the circuit layer may further include a fourth driving circuit disposed between the second driving circuit and the third driving circuit in the first direction, and each of the plurality of pixel circuits may be electrically connected to closer one of the first driving circuit and the third driving circuit and to closer one of the second driving circuit and the fourth driving circuit.

In an embodiment, the plurality of light emitting elements may include a first light emitting element group overlapping the first driving circuit, the second driving circuit, the third driving circuit, and the fourth driving circuit in a plan view and a second light emitting element group overlapping the plurality of pixel circuits in a plan view. Each of the plurality of light emitting elements in the first light emitting element group may be electrically connected to adjacent one of the plurality of pixel circuits through a connection line.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1A:
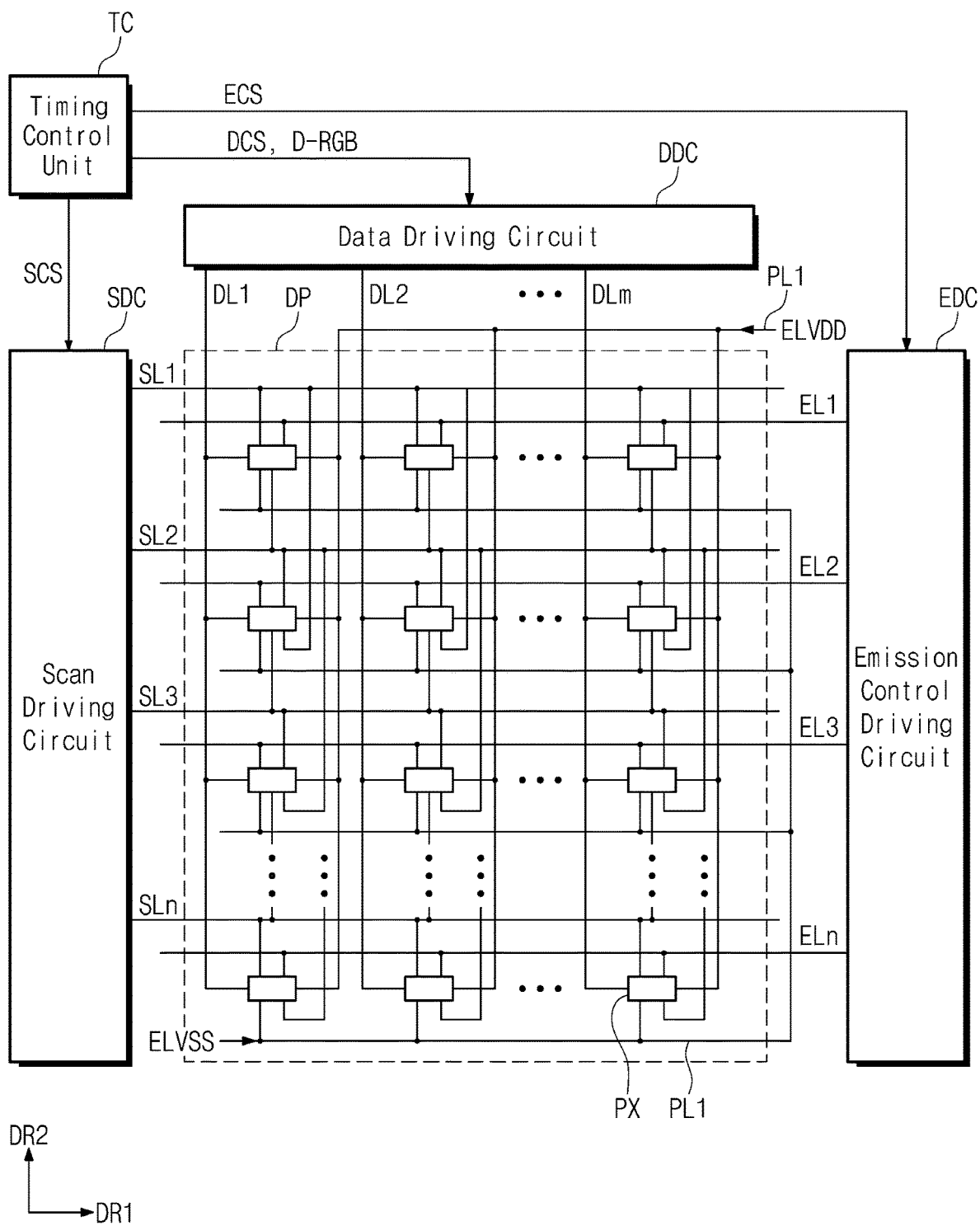
FIG. 1A is a schematic block diagram of an electronic device according to an embodiment of the disclosure.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Like reference numerals refer to like elements. Also, in the drawings, the thickness, the ratio, and the dimensions of elements are exaggerated for an effective description of technical contents.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the disclosure. The terms of a singular form may include plural forms unless the context clearly indicates otherwise.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

FIG. 1A is a schematic block diagram of an electronic device according to an embodiment of the disclosure. The electronic device according to the disclosure may be a semiconductor device including at least one semiconductor. The electronic device may include a timing control unit TC, a scan driving circuit SDC, a data driving circuit DDC, an emission control driving circuit EDC, and a display panel DP. The display panel DP may display an image according to an electrical signal.

In the specification, the display panel DP is described as an organic light emitting display panel. However, the disclosure is not limited thereto, and the display panel DP may include various embodiments.

The timing control unit TC may receive input image signals (not shown) and convert data formats of the input image signals to match interface specifications with the data driving circuit DDC, thereby generating image data D-RGB. The timing control unit TC may output the image data D-RGB and various control signals DCS, SCS and ECS.

The scan driving circuit SDC may receive a scan control signal SCS from the timing control unit TC. The scan control signal SCS may include a vertical start signal for starting the operation of the scan driving circuit SDC, a clock signal for determining the output timing of multiple signals, and the like.

The scan driving circuit SDC may generate the scan signals, and sequentially output the scan signals to scan lines SL1 to SLn.

The emission control driving circuit EDC may receive an emission control signal ECS from the timing control unit TC. The emission control driving circuit EDC may generate multiple emission control signals in response to the emission control signal ECS, and output emission driving signals to emission control lines EL1 to ELn.

In the disclosure, the scan signals and the emission driving signals may be divided and output from the scan driving circuit SDC and the emission control driving circuit EDC, but without being limited thereto, the emission control driving circuit EDC may be omitted, and the scan signals and the emission driving signals may be output from the scan driving circuit SDC.

The data driving circuit DDC may receive a data control signal DCS and the image data D-RGB from the timing control unit TC. The data driving circuit DDC may convert the image data D-RGB into data signals, and output the data signals to data lines DL1 to DLm. The data signals may be analog voltages corresponding to gray scale values of the image data D-RGB.

The display panel DP may include the scan lines SL1 to SLn, the emission control lines EL1 to ELn, the data lines DL1 to DLm, and pixels PX. The scan lines SL1 to SLn may extend in a first direction DR1 and may be arranged in a second direction DR2 intersecting the first direction DR1.

Each of the emission control lines EL1 to ELn may be arranged in parallel to a corresponding scan line among the scan lines SL1 to SLn. The data lines DL1 to DLm may intersect the scan lines SL1 to SLn and may be insulated therefrom.

Each of pixels PX may be connected to a corresponding scan line among the scan lines SL1 to SLn, a corresponding emission control line among the emission control lines EL1 to ELn, and a corresponding data line among the data lines DL1 to DLm.

Each of the pixels PX may receive a first power voltage ELVDD and a second power voltage ELVSS having a lower level than the first driving voltage ELVDD. Each of the pixels PX may be connected to a first driving power line PL1 to which the first power voltage ELVDD is applied and a second driving power line PL2 to which the second power voltage ELVSS is applied.

According to an embodiment of the disclosure, each of the pixels PX may be electrically connected to three scan lines. As illustrated in FIG. 1A, pixels on a second pixel row may be connected to first to third scan lines SL1 to SL3.

The display panel DP may further include multiple dummy scan lines. The display panel DP may include a first dummy scan line connected to pixels PX of a first pixel row and a second dummy scan line connected to pixels PX of an n-th pixel row. Pixels (for example, pixels of a pixel column) may be connected to a data line among the data lines DL1 to DLm. However, the disclosure is not limited thereto, and connection relationship of the pixels PX may be variously designed.

Each of the pixels PX may include a light emitting element ED (see FIG. 1B) and a pixel circuit PC (see FIG. 1B) which controls the light emission of the light emitting element ED. The pixel circuit PC may include at least one thin film transistor and a capacitor.

In an embodiment, at least one of the scan driving circuit SDC, the emission control driving circuit EDC, and the data driving circuit DDC may include driving transistors formed through a same process as the pixel circuit PC. In an embodiment, the scan driving circuit SDC, the emission control driving circuit EDC, and the data driving circuit DDC may be configured in a chip form, and be mounted on the display panel DP. In an embodiment, two of the scan driving circuit SDC, the emission control driving circuit EDC, and the data driving circuit DDC may be configured in a chip form and mounted on the display panel DP, and the remaining one thereof may be provided on a separate circuit board independent from the display panel DP and be connected to the display panel DP.

Figure 1B:
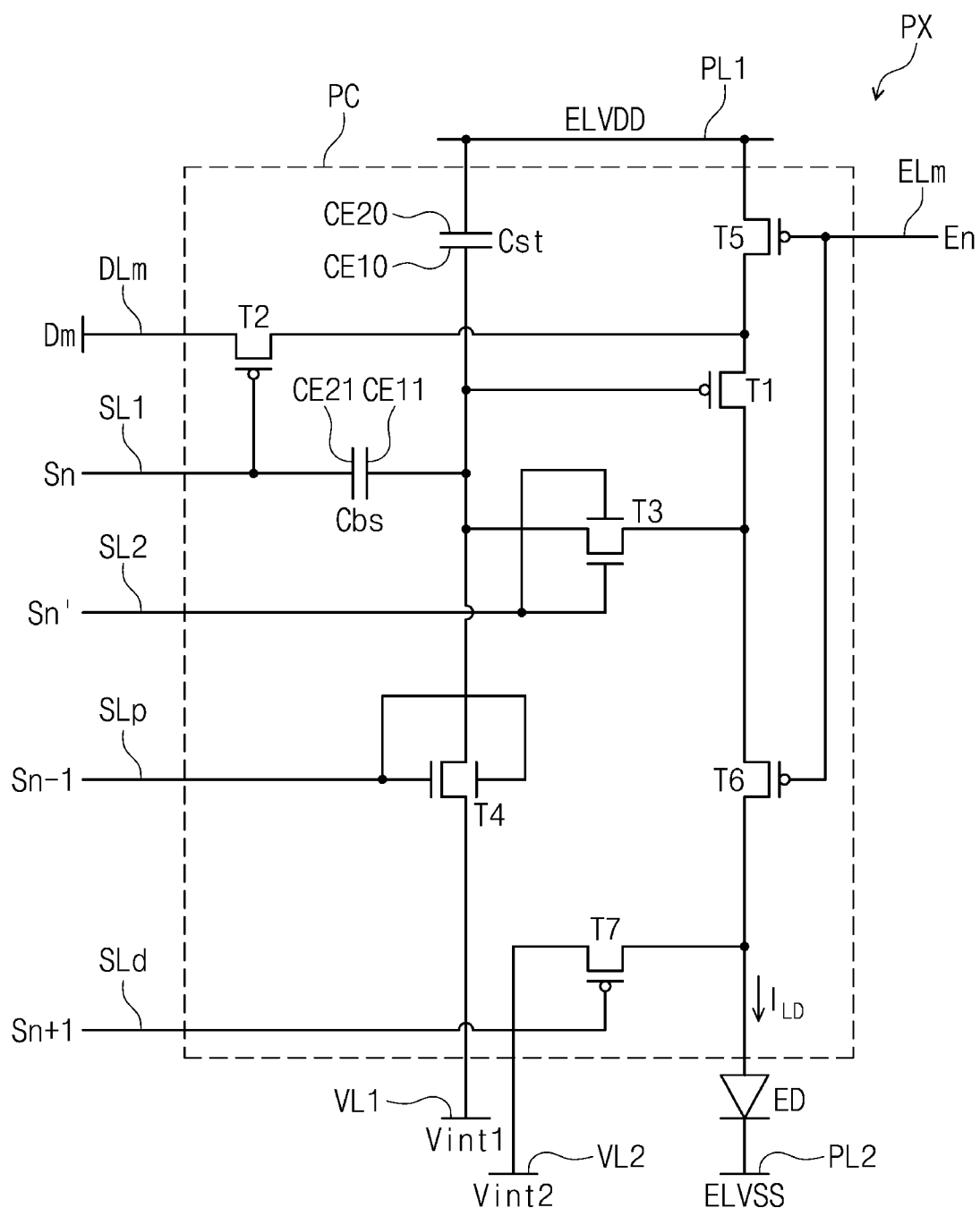
FIG. 1B is a schematic diagram of an equivalent circuit of a pixel according to an embodiment of the disclosure.

FIG. 1B is a schematic diagram of an equivalent circuit of a pixel according to an embodiment of the disclosure.

Referring to FIG. 1B, according to an embodiment, a pixel PX may include a light emitting element ED and a pixel circuit PC. The light emitting element ED may be a component included in a light emitting element layer EDL of FIG. 4A, and the pixel circuit PC may be a component included in a circuit layer CL of FIG. 4A.

The pixel circuit PC may include multiple thin film transistors T1 to T7 and a storage capacitor Cst. The thin film transistors T1 to T7 and the storage capacitor Cst may be electrically connected to signal lines SL1, SL2, SLp, SLd, ELm, and DLm, a first initialization voltage line VL1, a second initialization voltage line VL2 (or an anode initialization voltage line), and the first and second driving power lines PL1 and PL2.

The thin film transistors T1 to T7 may include a driving thin film transistor T1 (or a first transistor), a switching thin film transistor T2 (or a second transistor), a compensation thin film transistor T3 (or a third transistor), a first initialization thin film transistor T4 (or a fourth transistor), an operation control thin film transistor T5 (or a fifth transistor), a emission control thin film transistor T6 (or a sixth transistor), and a second initialization thin film transistor T7 (or a seventh transistor).

The light emitting element ED may include a first electrode (e.g., an anode electrode or a pixel electrode) and a second electrode (e.g., a cathode electrode or a common electrode). According to an embodiment, the first electrode of the light emitting element ED may be electrically connected to the driving thin film transistor T1 through the emission control thin film transistor T6 and be provided with a driving current $I_{LD}$, and the second electrode of the light emitting element ED may be electrically connected to the second driving power line PL2 and be provided with the second power voltage ELVSS. The light emitting element ED may generate light of luminance corresponding to the driving current $I_{LD}$.

Some of the thin film transistors T1 to T7 may be n-channel MOSFETs (NMOS), and the rest thereof may be p-channel MOSFETs (PMOS). In an embodiment, the compensation thin film transistor T3 and the first initialization thin film transistor T4 of the thin film transistors T1 to T7 may be n-channel MOSFETs (NMOS), and the rest thereof may be p-channel MOSFETs (PMOS). However, the disclosure is not limited thereto.

According to an embodiment of the disclosure, the compensation thin film transistor T3, the first initialization thin film transistor T4, and the second initialization thin film transistor T7 of the thin film transistors T1 to T7 may be NMOSs, and the rest thereof may be PMOSs. According to an embodiment of the disclosure, only one of the thin film transistors T1 to T7 may be an NMOS, and the rest thereof may be PMOSs. According to an embodiment of the disclosure, all of the thin film transistors T1 to T7 may be NMOSs, or may be PMOSs.

The signal lines may include a first current scan line SL1 which transmits a first scan signal Sn, a second current scan line SL2 which transmits a second scan signal Sn', a prior scan line SLp which transmits a prior scan signal Sn−1 to the first initialization thin film transistor T4, a emission control line ELm which transmits an emission driving signal En to the operation control thin film transistor T5 and to the emission control thin film transistor T6, a next scan line SLd which transmits a next scan signal Sn+1 to the second initialization thin film transistor T7, and a data line DLm which crosses the first current scan line SL1 and transmits a data signal Dm.

The first driving power line PL1 may transmit the first power voltage ELVDD to the driving thin film transistor T1, and the first initialization voltage line VL1 may transmit an initialization voltage Vint1 which initializes the driving thin film transistor T1 and the first electrode of the light emitting element ED.

A gate of the driving thin film transistor T1 may be connected to the storage capacitor Cst, a source of the driving thin film transistor T1 may be connected to the first driving power line PL1 via the operation control thin film transistor T5, and a drain of the driving thin film transistor T1 may be electrically connected to the first electrode of the light emitting element ED via the emission control thin film transistor T6. The driving thin film transistor T1 may receive the data signal Dm in accordance with a switching operation of the switching thin film transistor T2 and supply the driving current $I_{LD}$ to the light emitting element ED.

A gate of the switching thin film transistor T2 may be connected to the first current scan line SL1 which transmits the first scan signal Sn, a source of the switching thin film transistor T2 may be connected to the data line DLm, and a drain of the switching thin film transistor T2 may be connected to the source of the driving thin film transistor T1 and be connected to the first driving power line PL1 via the operation control thin film transistor T5. The switching thin film transistor T2 may be turned on in accordance with the first scan signal Sn received through the first current scan line SL1 and perform a switching operation of transmitting the data signal Dm transmitted through the data line DLm to the source of the driving thin film transistor T1.

A gate of the compensation thin film transistor T3 may be connected to the second current scan line SL2. A drain of the compensation thin film transistor T3 may be connected to the drain of the driving thin film transistor T1 and be connected to the first electrode of the light emitting element ED via the emission control thin film transistor T6. A source of the compensation thin film transistor T3 may be connected to a first capacitor electrode CE10 of the storage capacitor Cst and to the gate of the driving thin film transistor T1. The source of the compensation thin film transistor T3 may be also connected to a drain of the first initialization thin film transistor T4.

The compensation thin film transistor T3 may be turned on in accordance with the second scan signal Sn' received through the second scan line SL2 and electrically connect the gate of the driving thin film transistor T1 and the drain thereof to diode connect the driving thin film transistor T1.

A gate of the first initialization thin film transistor T4 may be connected to the prior scan line SLp. A source of the first initialization thin film transistor T4 may be connected to the first initialization voltage line VL1. The drain of the first initialization thin film transistor T4 may be connected to the first capacitor electrode CE10 of the storage capacitor Cst, the source of the compensation thin film transistor T3, and the gate of the driving thin film transistor T1. The first initialization thin film transistor T4 may be turned on in accordance with the prior scan signal Sn−1 received through the prior scan line SLp and perform an initialization operation of initializing a voltage of the gate of the driving thin film transistor T1 by transmitting the initialization voltage Vint1 to the gate of the driving thin film transistor T1.

A gate of the operation control thin film transistor T5 may be connected to the emission control line ELm, a source of the operation control thin film transistor T5 may be connected to the first driving voltage line PL1, and a drain of the operation control thin film transistor T5 may be connected to the source of the driving thin film transistor T1 and to the drain of the switching thin film transistor T2.

A gate of the emission control thin film transistor T6 may be connected to the emission control line ELm, a source of the emission control thin film transistor T6 may be connected to the drain of the driving thin film transistor T1 and to the drain of the compensation thin film transistor T3, and a drain of the emission control thin film transistor T6 may be electrically connected to a drain of the second initialization thin film transistor T7 and to the first electrode of the light emitting element ED.

The operation control thin film transistor T5 and the emission control thin film transistor T6 may be simultaneously turned on in accordance with the emission driving signal En received through the emission control line ELm, so that the first power voltage ELVDD may be transmitted to the light emitting element ED to transmit the driving current $I_{LD}$ to the light emitting element ED.

A gate of the second initialization thin film transistor T7 may be connected to the next scan line SLd, the drain of the second initialization thin film transistor T7 may be connected to the drain of the emission control thin film transistor T6 and to the first electrode of the light emitting element ED, and a source of the second initialization thin film transistor T7 may be connected to the second initialization voltage line VL2 to be provided with an anode initialization voltage Vint2. The second initialization thin film transistor T7 may be turned on in accordance with the next scan signal Sn+1 received through the next scan line SLd and initialize the first electrode of the light emitting element ED.

In another embodiment, the gate of the second initialization thin film transistor T7 may be connected to the emission control line ELm and be driven in accordance with the emission driving signal En. The position of a source and the position of a drain are interchangeable depending on the type (p-type or n-type) of a transistor.

The storage capacitor Cst may include the first capacitor electrode CE10 and a second capacitor electrode CE20. The first capacitor electrode CE10 of the storage capacitor Cst may be connected to the gate of the driving thin film transistor T1, and the second capacitor electrode CE20 of the storage capacitor Cst may be connected to the first driving power line PL1. In the storage capacitor Cst, electric charges corresponding to the difference between a voltage of the gate of the driving thin film transistor T1 and the first power voltage ELVDD may be stored.

A boosting capacitor Cbs may include a first capacitor electrode CE11 and a second capacitor electrode CE21. The first capacitor electrode CE11 of the boosting capacitor Cbs may be connected to the first capacitor electrode CE11 of the storage capacitor Cst, and the second capacitor electrode CE21 of the boosting capacitor Cbs may be provided with the first scan signal Sn. The boosting capacitor Cbs may increase the voltage of the gate of the driving thin film transistor T1 at the time the supply of the first scan signal Sn is stopped, thereby compensating for a voltage drop of the gate.

The specific operation of each pixel PX according to an embodiment will be described.

During an initialization period, in case that the prior scan signal Sn−1 is supplied through the prior scan line SLp, the first initialization thin film transistor T4 may be turned on in response to the prior scan signal Sn−1, and the driving thin film transistor T1 may be initialized by the initialization voltage Vint1 supplied from the first initialization voltage line VL1.

During a data programming period, in case that the first scan signal Sn and the second scan signal Sn' are supplied through the first current scan line SL1 and the second current scan line SL2, the switching thin film transistor T2 and the compensation thin film transistor T3 may be turned on in response to the first scan signal Sn and the second scan signal Sn'. The driving thin film transistor T1 may be diode connected by the turned-on compensation thin film transistor T3, and may be biased in a forward direction.

A compensation voltage Dm+Vth (wherein Vth is the value of (−)) reduced by a threshold voltage Vth of the driving thin film transistor T1 from the data signal Dm supplied from the data line DLm may be applied to the gate of the driving thin film transistor T1.

To both ends of the storage capacitor Cst, the first power voltage ELVDD and the compensation voltage Dm+Vth may be applied, and in the storage capacitor Cst, electric charges corresponding to the voltage difference between the ends may be stored.

During a light emission period, the operation control thin film transistor T5 and the emission control thin film transistor T6 may be turned on by the emission driving signal En supplied from the emission control line ELm. The driving current $I_{LD}$ corresponding to the voltage difference between the voltage of the gate of the driving thin film transistor T1 and the first power voltage ELVDD is generated, and the driving current $I_{LD}$ is supplied to the light emitting element ED through the emission control thin film transistor T6.

In the embodiment, at least one of the thin film transistors T1 to T7 may include a semiconductor layer including an oxide, and the rest thereof may include a semiconductor layer including silicon.

In an embodiment, the driving thin film transistor T1 which affects the brightness of an electronic device may include a semiconductor layer made of polycrystalline silicon having high reliability, through which a high-resolution electronic device may be implemented.

Since an oxide semiconductor has high carrier mobility and low leakage current, a voltage drop may be not large even in case that driving time is long. Since there is no significant change in the color of an image due to a voltage drop even during low-frequency driving, low-frequency driving may be possible.

Since the oxide semiconductor has the advantage of low leakage current as described above, at least one of the compensation thin film transistor T3, the first initialization thin film transistor T4, and the second initialization thin film transistor T7 which are connected to the gate of the driving thin film transistor T1 may be configured as an oxide semiconductor to prevent leakage current which may flow to the gate and to reduce power consumption.

Figure 2:
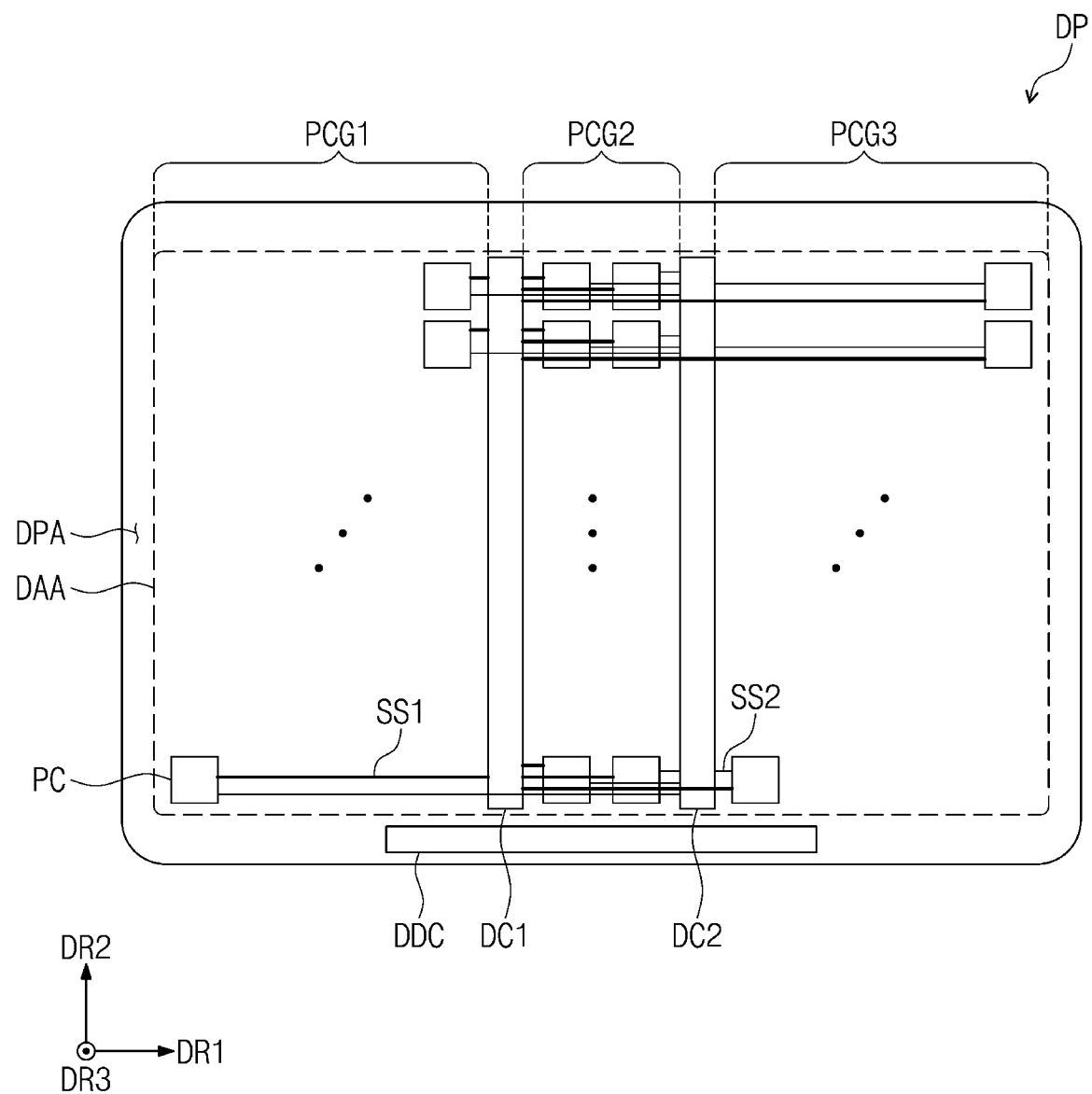
FIG. 2 is a plan view schematically illustrating a display panel according to an embodiment of the disclosure.

FIG. 2 is a plan view schematically illustrating a display panel according to an embodiment of the disclosure.

Hereinafter, a direction substantially perpendicular to a plane defined by the first direction DR1 and the second direction DR2 is defined as a third direction DR3. In the disclosure, "in a plan view" may be defined as a view in the third direction DR3.

A thickness direction of the display panel DP may be a direction parallel to the third direction axis DR3, which is a normal direction with respect to the plane defined by the first direction DR1 and the second direction DR2. In the disclosure, the "thickness" may be a numerical value measured in the third direction DR3, and the "width" may be a numerical value measured in the first direction DR1 or the second direction DR2, which is a horizontal direction.

Referring to FIG. 2, the display panel DP may include the data driving circuit DDC, a first driving circuit DC1, a second driving circuit DC2, and multiple pixel circuits PC. Also, the display panel DP may include a display region DAA and a peripheral region DPA. The peripheral region DPA may be disposed adjacent to the display region DAA. In the embodiment, the peripheral region DPA is illustrated as having a shape surrounding the display region DAA. However, the disclosure is not limited thereto, and the peripheral region DPA may be omitted.

The first driving circuit DC1, the second driving circuit DC2, and the pixel circuits PC may be disposed in the display region DAA. Since the first driving circuit DC1 and the second driving circuit DC2 are disposed in the display region DAA, the area occupied by the first driving circuit DC1 and the second driving circuit DC2 in the peripheral region DPA may be reduced. Accordingly, the area of the peripheral region DPA may be reduced, so that the electronic device having a narrow bezel may be implemented.

The data driving circuit DDC may be disposed in the peripheral region DPA. For example, the data driving circuit DDC may be disposed below the display region DAA in the second direction DR2 in a plan view. However, the disclosure is not limited thereto, and the data driving circuit DDC may be disposed in the display region DAA. The data driving circuit DDC, the first driving circuit DC1, and the second driving circuit DC2 may be formed in a same process. However, the disclosure is not limited thereto. According to an embodiment of the disclosure, the data driving circuit DDC may be provided as a separate circuit board independent from the display panel DP and be connected to the display panel DP.

In the display region DAA, the first driving circuit DC1 and the second driving circuit DC2 may be spaced apart from each other. In an embodiment, the first driving circuit DC1 and the second driving circuit DC2 may be spaced apart from each other in the first direction DR1.

The first driving circuit DC1 and the second driving circuit DC2 may be same or different from each other. For example, the first driving circuit DC1 and the second driving circuit DC2 may be different from each other. In an embodiment, the first driving circuit DC1 may be a scan driving circuit which provides scan signals to the pixel circuits PC, and the second driving circuit DC2 may be an emission control driving circuit which provides emission driving signals to the pixel circuits PC. However, the disclosure is not limited thereto.

In the first direction DR1, each of the first driving circuit DC1 and the second driving circuit DC2 may be disposed between the pixel circuits PC. In an embodiment, each of the first driving circuit DC1 and the second driving circuit DC2 may extend in the second direction DR2. However, the disclosure is not limited thereto.

The pixel circuits PC may be divided into multiple groups according to regions in which the pixel circuits PC are disposed. For example, the pixel circuits PC may be divided into a first pixel circuit group PCG1 disposed on the left side of the first driving circuit DC1, a second pixel circuit group PCG2 disposed between the first driving circuit DC1 and the second driving circuit DC2, and a third pixel circuit group PCG3 disposed on the right side of the second driving circuit DC2 in a plan view. In FIG. 2, the right side may be the first direction DR1 and the left side may be a direction opposite to the first direction DR1. For example, the first pixel circuit group PCG1 and the second pixel circuit group PCG2 may be spaced apart from each other in the first direction DR1. The first driving circuit DC1 may be interposed between the first pixel circuit group PCG1 and the second pixel circuit group PCG2. The second pixel circuit group PCG2 and the third pixel circuit group PCG3 may be spaced apart from each other in the first direction DR1. The second driving circuit DC2 may be interposed between the second pixel circuit group PCG2 and the third pixel circuit group PCG3.

The first driving circuit DC1 may provide a first signal SS1 to the pixel circuits PC in the first to third pixel circuit groups PCG1, PCG2, and PCG3, and the second driving circuit DC2 may provide a second signal SS2 to the pixel circuits PC in the first to third pixel circuit groups PCG1, PCG2, and PCG3. The first signal SS1 may be one of a scan signal and an emission driving signal, and the second signal SS2 may be another one of the scan signal and the emission driving signal.

Figure 3A:
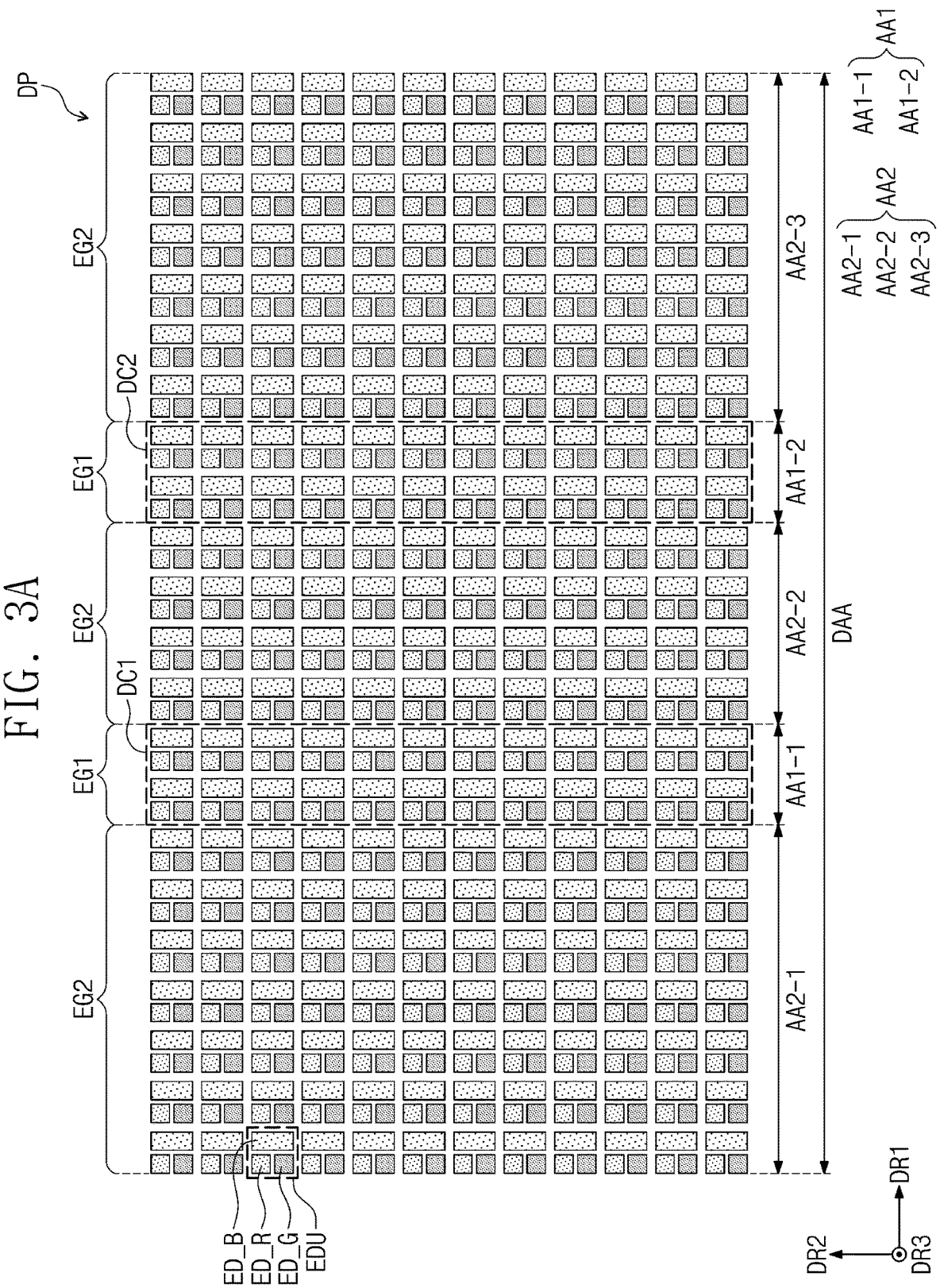
FIG. 3A is a plan view schematically illustrating a display panel according to an embodiment of the disclosure.

FIG. 3A is a plan view schematically illustrating a display panel according to an embodiment of the disclosure. FIG. 3A illustrates the light emitting element layer EDL (see FIG. 3B) of the display panel DP according to an embodiment of the disclosure.

Referring to FIG. 2 and FIG. 3A together, the display region DAA may be divided into a first region AA1 and a second region AA2. The first region AA1 may be a region in which the first driving circuit DC1 and the second driving circuit DC2 are disposed, and the second region AA2 may be a region in which the pixel circuits PC are disposed.

The first region AA1 and the second region AA2 may each be provided in plural. The first region AA1 may include a first-first region AA1-1 in which the first driving circuit DC1 is disposed and a first-second region AA1-2 in which the second driving circuit DC2 is disposed. The second region AA2 may include a second-first region AA2-1 in which the first pixel circuit group PCG1 is disposed, a second-second region AA2-2 in which the second pixel circuit group PCG2 is disposed, and a second-third region AA2-3 in which the third pixel circuit group PCG3 is disposed.

Light emitting elements ED_R, ED_G, and ED_B may include a first light emitting element ED_R which emits a first light, a second light emitting element ED_G which emits a second light, and a third light emitting element ED_B which emits a third light. A first light emitting element ED_R, a second light emitting element ED_G, and a third light emitting element ED_B may constitute a light emitting element unit EDU. In the embodiment, a light emitting element unit EDU may correspond to a pixel, and each of the first to third light emitting elements ED_R, ED_G, and ED_B may correspond to a sub pixel, but the disclosure is not limited thereto.

The light emitting elements ED_R, ED_G, and ED_B may be divided into multiple groups according to regions in which the light emitting elements ED_R, ED_G, and ED_B are disposed. For example, the light emitting elements ED_R, ED_G, and ED_B may be divided into a first light emitting element group EG1 disposed in the first region AA1 and a second light emitting element group EG2 disposed in the second region AA2. For example, the first light emitting element group EG1 may overlap the first driving circuit DC1 and the second driving circuit DC2 in a plan view, and the second light emitting element group EG2 may overlap the pixel circuits PC in a plan view. The area of the first light emitting element group EG1 and the area of the second light emitting element group EG2 in a plan view may be same or different from each other. In FIG. 3A, the area of the first light emitting element group EG1 is illustrated as less than the area of the second light emitting element group EG2, but the disclosure is not limited thereto.

The first light emitting element group EG1 may overlap the front surface of each of the first driving circuit DC1 and the second driving circuit DC2 in a plan view. For driving, the first light emitting element group EG1 may be connected to adjacent pixel circuits PC among the pixel circuits PC through a connection line.

Figure 3B:
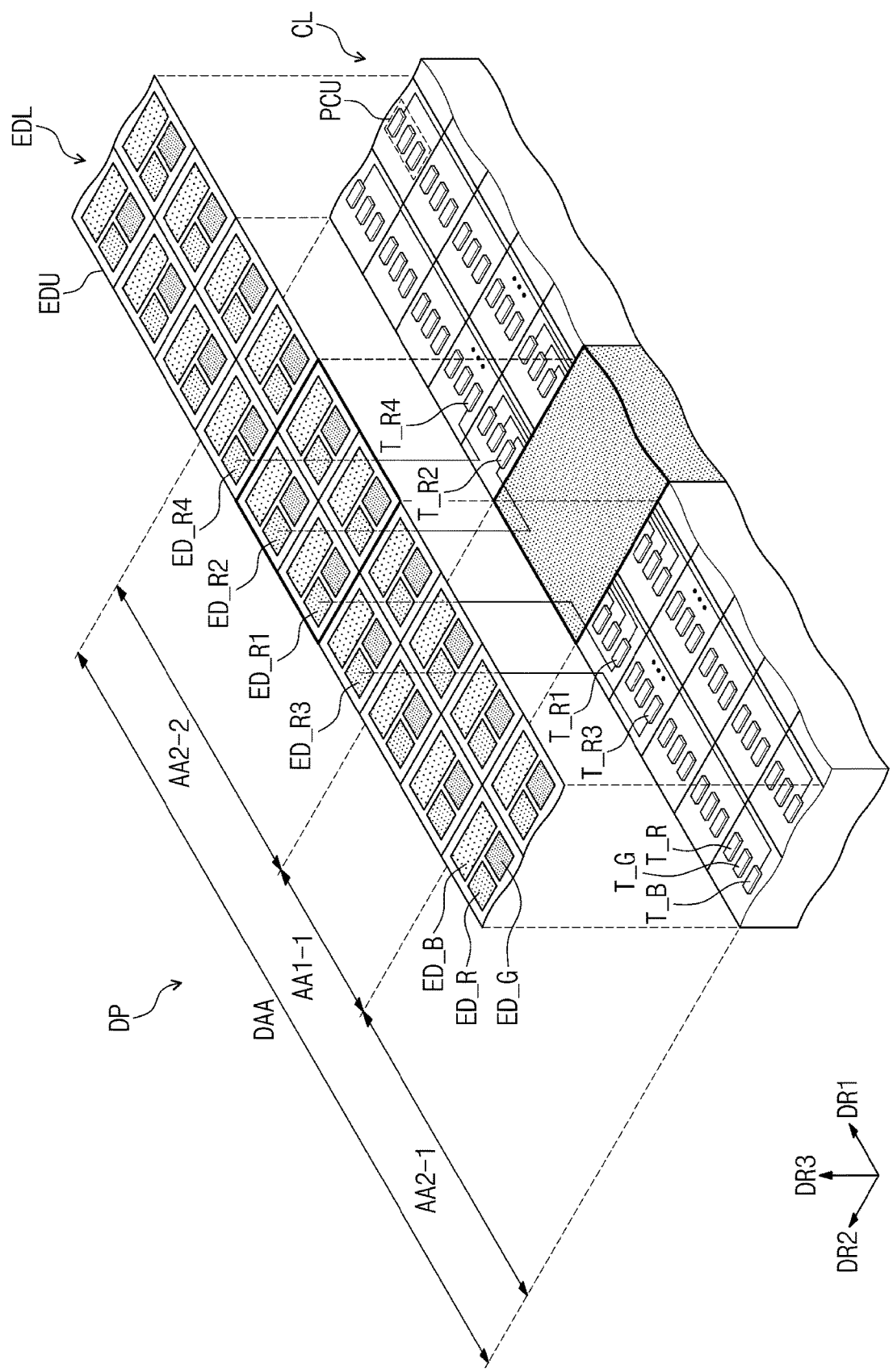
FIG. 3B is a perspective exploded view schematically illustrating a display panel according to an embodiment of the disclosure.
Figure 3C:
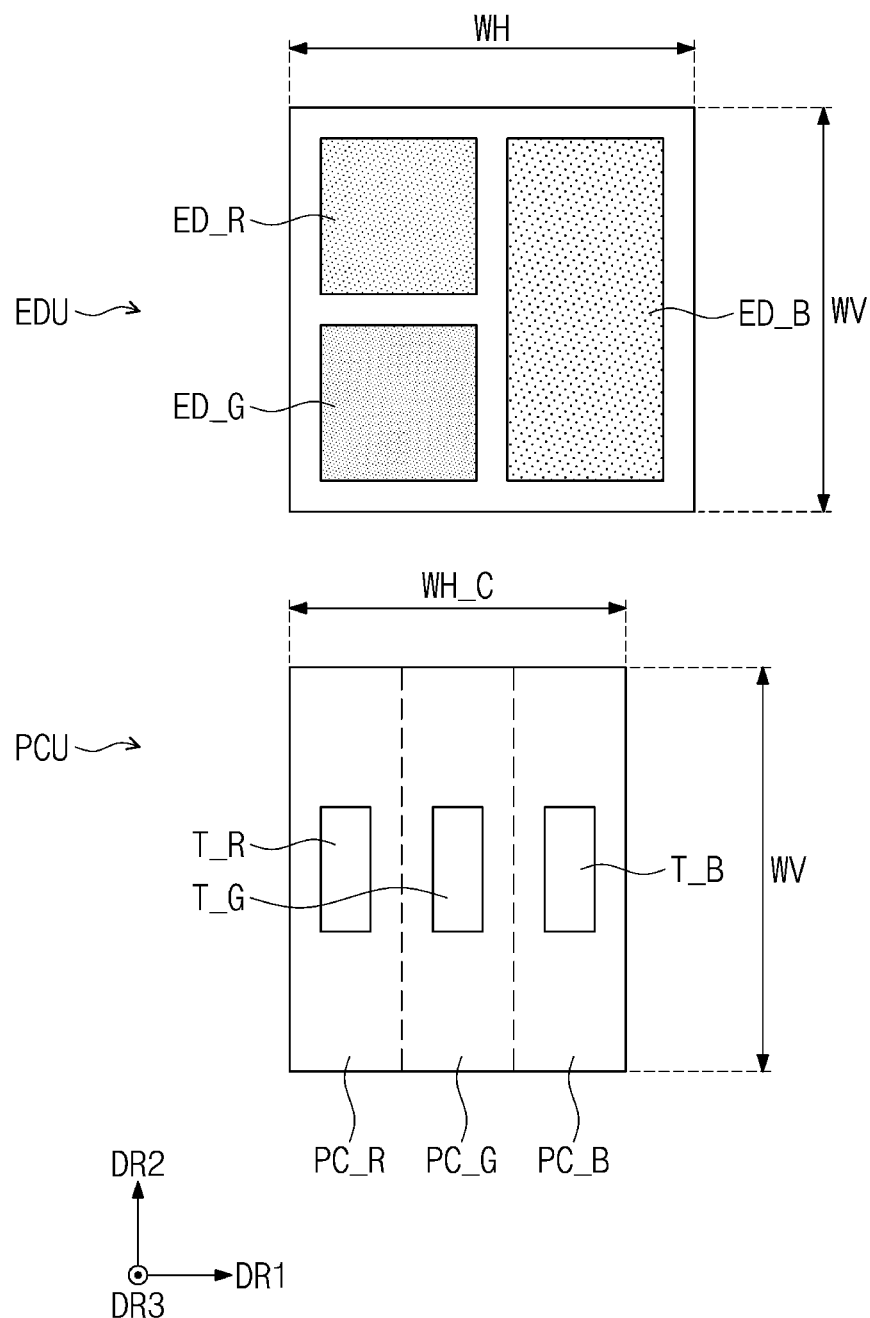
FIG. 3C is an enlarged plan view of a partial region of a display panel according to an embodiment of the disclosure.

FIG. 3B is a perspective exploded view schematically illustrating a display panel according to an embodiment of the disclosure. FIG. 3C is an enlarged plan view of a partial region of a display panel according to an embodiment of the disclosure.

FIG. 3B illustrates the first-first region AA1-1, a portion of the second-first region AA2-1, and a portion of the second-second region AA2-2 of the display panel DP. The light emitting element layer EDL including the light emitting element units EDU and the circuit layer CL including pixel circuit units PCU are separately illustrated in FIG. 3B. The pixel circuit units PCU may be connected to corresponding light emitting element units EDU among the light emitting element units EDU and drive the connected light emitting element units EDU. The pixel circuit units PCU may be disposed in the display region DAA. The pixel circuit units PCU may include first to third pixel transistors T_R, T_G, and T_B respectively connected to the light emitting elements ED_R, ED_G, and ED_B. The first to third pixel transistors T_R, T_G, and T_B may correspond to the emission control thin film transistor T6 described above with respect to FIG. 1B.

For ease of description, FIG. 3B illustrates light emitting element units EDU of 2 rows and 10 columns and pixel circuit units PCU of 2 rows and 10 columns corresponding thereto. However, the disclosure is not limited thereto.

As illustrated in FIG. 3B, a light emitting element unit EDU (i.e., the light emitting element unit EDU included in the first light emitting element group EG1 (see FIG. 3A)) disposed in the first-first region AA1-1 among the light emitting element units EDU may overlap the first driving circuit DC1 and may not overlap the pixel circuit units PCU in a plan view. A light emitting element unit EDU (i.e., the light emitting element unit EDU included in the second light emitting element group EG2 (see FIG. 3A)) disposed in the second-first region AA2-1 and the second-second region AA2-2 among the light emitting element units EDU may not overlap the first driving circuit DC1 (i.e., not overlapping) and may overlap the pixel circuit units PCU in a plan view.

FIG. 3C illustrates a light emitting element unit EDU and a pixel circuit unit PCU connected thereto.

In an embodiment, the first light emitting element ED_R and the second light emitting element ED_G in the light emitting element unit EDU may be arranged in the second direction DR2, and the third light emitting element ED_B may be disposed adjacent to the first light emitting element ED_R and the second light emitting element ED_G in the first direction DR1. In the embodiment, viewed in the first direction DR1, the third light emitting element ED_B may be in a size overlapping each of the first light emitting element ED_R and the second light emitting element ED_G. However, the disclosure is not limited thereto, and shapes or arrangements of the first to third light emitting elements ED_R, ED_G, and ED_B, or the number of light emitting elements constituting the light emitting element unit EDU may be variously selected.

The order in which the first to third light emitting elements ED_R, ED_G, and ED_B are arranged may be provided in various combinations according to required display quality. Areas of the first to third light emitting elements ED_R, ED_G, and ED_B are not limited to what is illustrated in FIG. 3C.

Figure 3D:
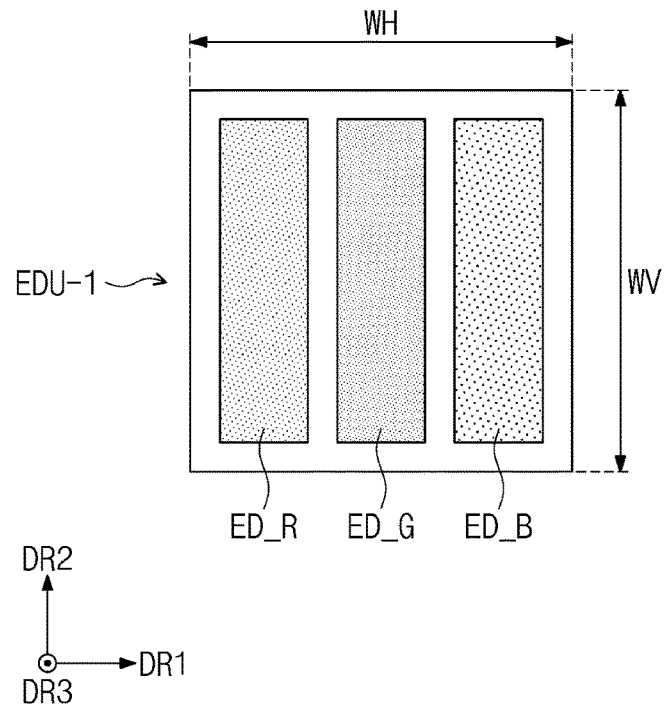
FIG. 3D is an enlarged plan view of a partial region of a display panel according to an embodiment of the disclosure.
Figure 3E:
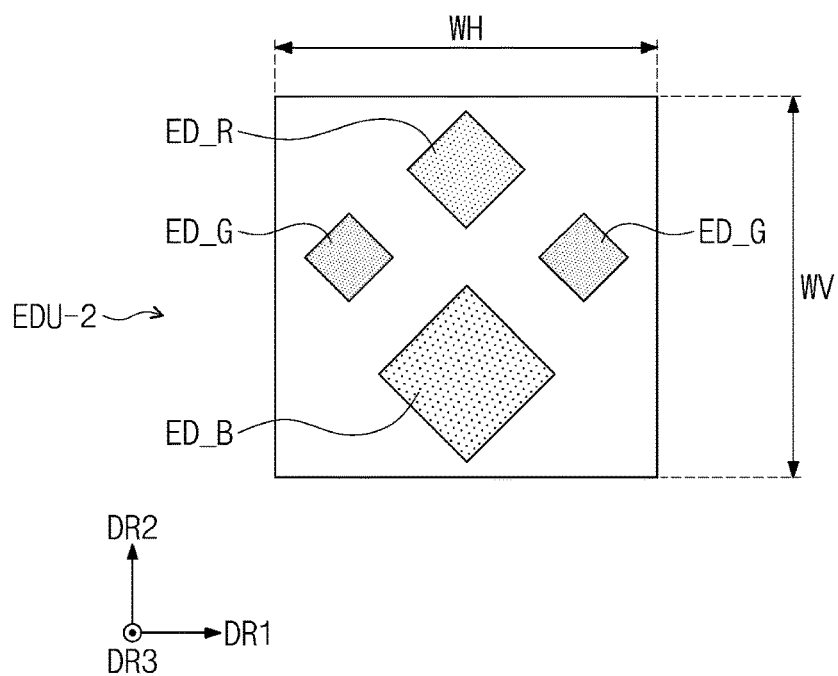
FIG. 3E is an enlarged plan view of a partial region of a display panel according to an embodiment of the disclosure.

FIG. 3D and FIG. 3E are each enlarged plan view of a partial region of a display panel according to an embodiment of the disclosure.

In an embodiment, as illustrated in FIG. 3D, a light emitting element unit EDU-1 may have a stripe pixel structure in which the first to third light emitting elements ED_R, ED_G, and ED_B are arranged in order in the first direction DR1. Areas of the first to third light emitting elements ED_R, ED_G, and ED_B may be same, but the disclosure is not limited thereto.

In an embodiment, as illustrated in FIG. 3E, in the light emitting element unit EDU-2, the first to third light emitting elements ED_R, ED_G, and ED_B may be arranged in a PENTILE™ form. For example, the light emitting element unit EDU-2 may have an arrangement form in which one first light emitting element ED_R, two second light emitting elements ED_G, and one third light emitting element ED_B form a diamond shape. In an embodiment, an area of the second light emitting elements ED_G may be smaller than areas of the first to third light emitting elements ED_R and ED_B in a plan view, but the disclosure is not limited thereto.

Referring back to FIG. 3C, the pixel circuit unit PCU may include first to third pixel circuits PC_R, PC_G, and PC_B which respectively drive the first to third light emitting elements ED_R, ED_G, and ED_B. The first to third pixel circuits PC_R, PC_G, and PC_B may be arranged in the first direction DR1. The first to third pixel circuits PC_R, PC_G, and PC_B may include the first to third pixel transistors T_R, T_G, and T_B which are respectively connected to the first to third light emitting elements ED_R, ED_G, and ED_B.

In an embodiment, a width WH of a light emitting element unit EDU in the first direction DR1 may be greater than a width WH_C of a pixel circuit unit PCU corresponding thereto in the first direction DR1. For ease of description, a length WV of the light emitting element unit EDU in the second direction DR2 is illustrated same as a length WV of the pixel circuit unit PCU, but the disclosure is not limited thereto.

By designing the width WH_C of the pixel circuit unit PCU to be smaller than the width WH of the light emitting element unit EDU, the light emitting element units EDU arranged in a row may be connected to the pixel circuit units PCU disposed in a same row, so that a larger display area may be provided to a user.

For example, the display panel DP of the disclosure may implement a narrow bezel by providing the display region DAA having a larger area than the area occupied by the circuit layer CL.

Referring back to FIG. 3A and FIG. 3B, the light emitting element unit EDU disposed in the first region AA1 may be connected to adjacent pixel circuit unit PCU disposed in the second region AA2 for driving. For example, a first light emitting element (e.g., a first red light emitting element ED_R1) disposed in the first-first region AA1-1 adjacent to the second-first region AA2-1 may be connected to a first pixel transistor (e.g., a first red pixel transistor T_R1) disposed in the second-first region AA2-1 most adjacent to the first driving circuit DC1. A first light emitting element (e.g., a second red light emitting element ED_R2) disposed in the first-first region AA1-1 adjacent to the second-second region AA2-2 may be connected to a first pixel transistor (e.g., a second red pixel transistor T_R2) disposed in the second-second region AA2-2 most adjacent to the first driving circuit DC1.

In an embodiment, the light emitting element unit EDU disposed in the second region AA2 may be connected to the pixel circuit unit PCU disposed in the second region AA2. For example, a first light emitting element (e.g., a third red light emitting element ED_R3) disposed in the second-first region AA2-1 may be connected to a corresponding first pixel transistor (e.g., a third red pixel transistor T_R3) disposed in the second-first region AA2-1. A first light emitting element (e.g., a fourth red light emitting element ED_R4) disposed in the second-second region AA2-2 may be connected to a corresponding first pixel transistor (e.g., a fourth red pixel transistor T_R4) disposed in the second-second region AA2-2.

The description of the light emitting element units EDU overlapping the first driving circuit DC1 in a plan view may be equally applied to the light emitting element units EDU overlapping the second driving circuit DC2 in a plan view.

According to an embodiment of the disclosure, the light emitting element units EDU overlapping the first driving circuit DC1 and the second driving circuit DC2 may be connected to the pixel circuit units PCU disposed adjacent to the first driving circuit DC1 and the second driving circuit DC2 through a connection line. Since each of the first driving circuit DC1 and the second driving circuit DC2 is disposed between the pixel circuit units PCU, the length of the connection line may be reduced to a minimum.

Figure 4A:
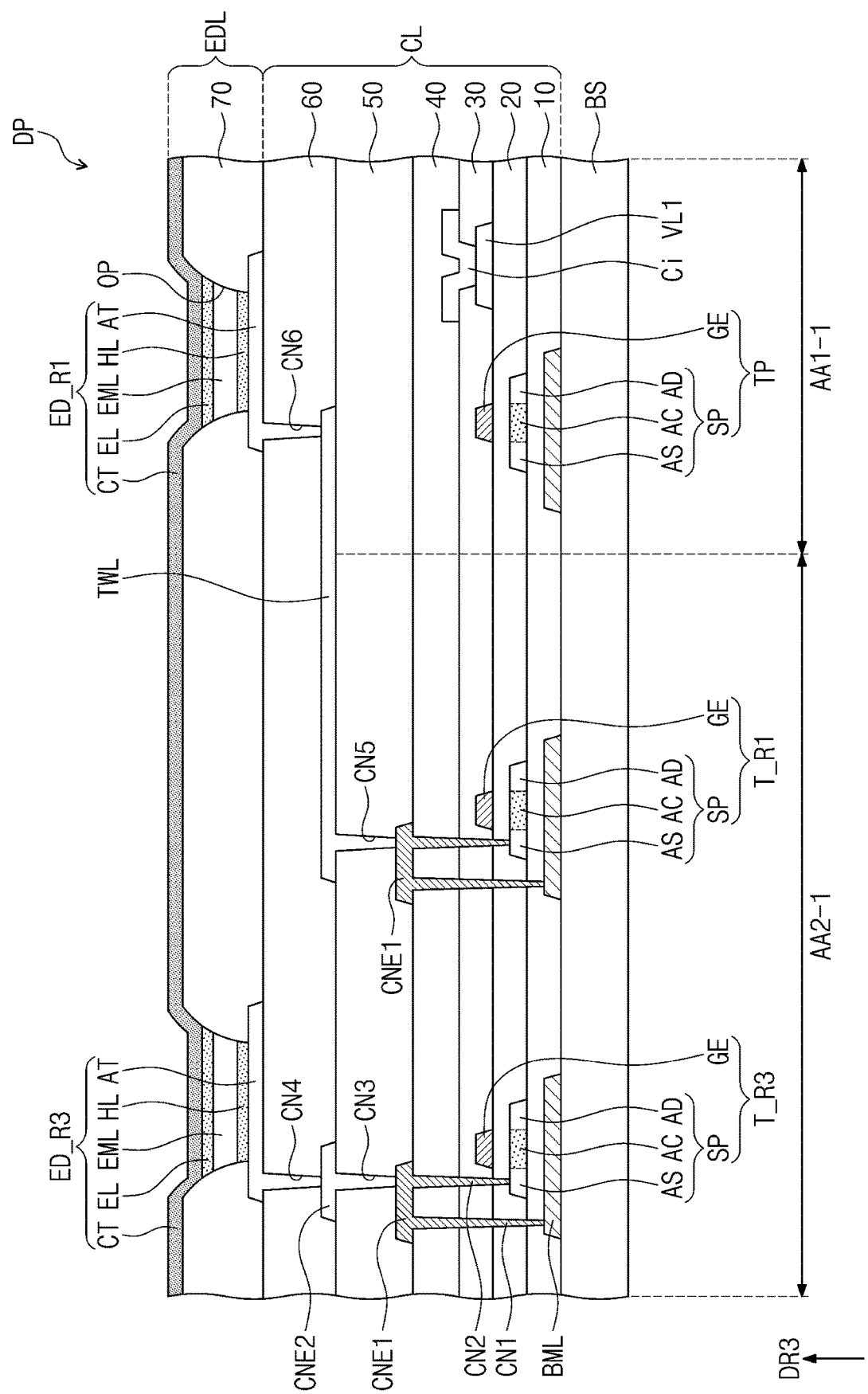
FIG. 4A is a schematic cross-sectional view of a display panel according to an embodiment of the disclosure.

FIG. 4A is a schematic cross-sectional view of a display panel according to an embodiment of the disclosure.

Referring to FIG. 4A, according to an embodiment, the display panel DP may include a base layer BS, the circuit layer CL disposed on the base layer BS, and the light emitting element layer EDL disposed on the circuit layer CL.

The base layer BS may be a member which provides a base surface on which the circuit layer CL is disposed. The base layer BS may be a glass substrate, a metal substrate, a polymer substrate, or the like. However, the disclosure is not limited thereto, and the base layer BS may be an inorganic layer, an organic layer, or a composite material layer.

The base layer BS may have a multi-layered structure. For example, the base layer BS may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be a base barrier layer.

In an embodiment, each of the first and second synthetic resin layers may include a polyimide-based resin. In an embodiment, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, a "~~"-based resin means that a functional group of "~~" is included.

The circuit layer CL may be disposed on the base layer BS. The circuit layer CL may include an insulation layer, a semiconductor pattern, a conductive pattern, a signal line, and the like. The insulation layer, a semiconductor layer, and a conductive layer may be formed above the base layer BS by coating, deposition, or the like, and the insulation layer, the semiconductor layer, and the conductive layer may be selectively patterned by performing a photolithography process multiple times. The semiconductor pattern, the conductive pattern, and the signal line included in the circuit layer CL may be formed.

FIG. 4A illustrates components of the display panel DP. In an embodiment, a driving transistor TP and the first initialization voltage line VL1 may be disposed in the first-first region AA1-1 of the circuit layer CL, and the first and third red pixel transistors T_R1 and T_R3 may be disposed in the second-first region AA2-1.

The driving transistor TP may be a transistor included in the first driving transistor DC1. Only one transistor is illustrated in FIG. 4A. However, the disclosure is not limited thereto, and the display panel may include two or more transistors. The first initialization voltage line VL1 may be disposed on a second insulation layer 20. A conductive line Ci disposed on a third insulation layer 30 may be connected to the first initialization voltage line VL1 through the third insulation layer 30, and may extend to the pixel circuits PC (see FIG. 1B), thereby providing the initialization voltage Vint1 (see FIG. 1B) to the pixel circuits PC.

The first and third red pixel transistors T_R1 and T_R3 may correspond to a first pixel transistor T_R connected to each of the first red light emitting element ED_R1 and the third red light emitting element ED_R3 in FIG. 3B.

The circuit layer CL may include multiple conductive patterns CNE1, CNE2, and TWL and insulation layers 10 to 60.

A first insulation layer 10 may be disposed on the base layer BS. The first insulation layer 10 may be an inorganic layer. For example, the first insulation layer 10 may include at least one of an aluminum oxide, a titanium oxide, a silicon oxide, a silicon nitride, a silicon oxynitride, a zirconium oxide, and a hafnium oxide. The first insulation layer 10 may include multiple layers. The multi-layered inorganic layers may constitute a barrier layer and/or a buffer layer.

The driving transistor TP, and the first and third red pixel transistors T_R1 and T_R3 may each include a gate electrode GE and a semiconductor pattern SP. The semiconductor pattern SP may be disposed on the first insulation layer 10. In an embodiment, the semiconductor pattern SP may include an oxide semiconductor. However, the disclosure is not limited thereto. In an embodiment, the semiconductor pattern SP may include amorphous silicon, low-temperature polycrystalline silicon, or polycrystalline silicon.

A second insulation layer 20 may commonly overlap multiple pixels, and may cover the semiconductor pattern SP. The second insulation layer 20 may be an inorganic layer and/or an organic layer, and may have a single-layered or multi-layered structure. The second insulation layer 20 may include at least one of an aluminum oxide, a titanium oxide, a silicon oxide, a silicon nitride, a silicon oxynitride, a zirconium oxide, and a hafnium oxide. In an embodiment of the embodiment, the second insulation layer 20 may be a single-layered silicon oxide layer.

The gate electrode GE may be disposed on the second insulation layer 20. The gate electrode GE may be disposed on the semiconductor pattern SP. However, the disclosure is not limited thereto, and gate electrode GE may be disposed on a lower side of the semiconductor pattern DP.

The semiconductor pattern SP may include a source AS, a drain AD, and a channel AC which are divided according to the degree of conductivity. The channel AC may be a portion overlapping the gate electrode GE in a plan view. The source AS and the drain AD may be portions disposed adjacent to the channel AC interposed therebetween. In case that the semiconductor pattern SP is an oxide semiconductor, the source AS and the drain AD may each be a reduced region. Accordingly, the source AS and the drain AD may have a relatively high reduced metal content compared to the channel AC. In case that the semiconductor pattern SP is polycrystalline silicon, the source AS and the drain AD may each be a region doped to a high concentration.

The source AS and the drain AD may have relatively high conductivity compared to the channel AC. The source AS may correspond to a source electrode of the first and third red pixel transistors T_R1 and T_R3, and the drain AD may correspond to a drain electrode of the first and third red pixel transistors T_R1 and T_R3. However, the disclosure is not limited thereto. The first and third red pixel transistors T_R1 and T_R3 may further be provided with a source electrode and a drain electrode respectively connected to the source AS, and to the drain AD.

According to an embodiment, a first connection electrode CNE1 may be disposed on the fourth insulation layer 40. The first connection electrode CNE1 may be connected to a lower electrode BML via a first through-hole CN1, and to the source AS via a second through-hole CN2. For example, the first connection electrode CNE1 may electrically connect the lower electrode BML and the source AS.

The lower electrode BML may be disposed on a lower side of the first and third red pixel transistors T_R1 and T_R3 and the driving transistor TP, and may overlap the first and third red pixel transistors T_R1 and T_R3 and the driving transistor TP in a plan view. The lower electrode BML may block an electric potential caused by polarization of the base layer BS from affecting the first and third red pixel circuits T_R1 and T_R3 and the driving transistor TP. Between the lower electrode BML and the base layer BS, at least one of an inorganic barrier layer or a buffer layer may be further disposed.

The lower electrode BML may include a reflective metal. For example, the lower electrode BML may include titanium (Ti), molybdenum (Mo), an alloy containing molybdenum, aluminum (Al), an alloy containing aluminum, an aluminum nitride (AlN), tungsten (W), a tungsten nitride (WN), copper (Cu), or the like. In another embodiment, the lower electrode BML may be provided in a form isolated from another electrode or another line.

According to an embodiment, a second connection electrode CNE2 may be disposed on a fifth insulation layer 50. The second connection electrode CNE2 may be connected to the first connection electrode CNE1 via a third through-hole CN3. An anode electrode AT of the third red light emitting element ED_R3 may be connected to the second connection electrode CNE2 via a fourth through-hole CN4. For example, the third red pixel transistor T_R3 may be electrically connected to the third red light emitting element ED_R3 through the second connection electrode CNE2.

In an embodiment, a connection line TWL may be disposed on the fifth insulation layer 50. The connection line TWL may be connected to the first connection electrode CNE1 via a fifth through-hole CN5. The connection line TWL may extend from the first-first region AA1-1 to the second-first region AA2-1. The connection line TWL may be connected to the first red pixel transistor T_R1 via the fifth through-hole in the second-first region AA2-1, and may be connected to the anode electrode AT of the first red light emitting element ED_R1, which is to be described below, via a sixth through-hole CN6 formed in the first-first region AA1-1. For example, through the connection line TWL, the first red light emitting element ED_R1 disposed in the first-first region AA1-1 may be connected to the first red pixel transistor T_R1 disposed in the second-first region AA2-1.

On the fourth insulation layer 40, the fifth insulation layer 50 and the sixth insulation layer 60 may be sequentially disposed in the third direction DR3. The fifth insulation layer 50 and the sixth insulation layer 60 may each be an organic layer. In an embodiment, the fifth insulation layer 50 and the sixth insulation layer 60 may each include a general purpose polymer such as benzocyclobutene (BCB), polyimide, hexamethyldisiloxane (HMDSO), polymethylmethacrylate (PMMA), polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, a blend thereof, or the like.

The light emitting element layer EDL may be disposed on the sixth insulation layer 60. The light emitting element layer EDL may include the first and third red light emitting elements ED_R1 and ED_R3 described above with reference to FIG. 3B, and a seventh insulation layer 70. The seventh insulation layer 70 may be disposed on the sixth insulation layer 60, and may have an opening OP. The opening OP may expose at least a portion of the anode electrode AT of the first and third red light emitting elements ED_R1 and ED_R3. A light emitting region of the first and third red light emitting elements ED_R1 and ED_R3 may substantially correspond to a shape of the anode electrode AT exposed by the opening OP.

The seventh insulation layer 70 may have light-absorbing properties or light-blocking properties. For example, the seventh insulation layer 70 may a black color. The seventh insulation 70 may include a black coloring agent. The black coloring agent may include a black dye or a black pigment. The black coloring agent may include carbon black, a metal such as chromium, or an oxide thereof.

The first and third red light emitting elements ED_R1 and ED_R3 may each include the anode electrode AT, a first common layer HL, a light emitting layer EML, a second common layer EL, and a cathode electrode CT. The anode electrode AT may be a transflective, transmissive, or reflective electrode. According to an embodiment of the disclosure, the anode electrode AT may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), a compound thereof, or the like, and a transparent or translucent electrode layer formed on the reflective layer. The transparent or translucent electrode layer may include at least one selected from the group consisting of an indium tin oxide (ITO), an indium zinc oxide (IZO), an indium gallium zinc oxide (IGZO), a zinc oxide (ZnO), an indium oxide (In2O3), and an aluminum-doped zinc oxide (AZO). For example, the anode electrode AT may include a laminated structure of ITO/Ag/ITO.

The anode electrode AT may be connected to the first and third red pixel transistors T_R1 and T_R3 via the through-holes CN4 and CN6. FIG. 4A illustrates the anode electrode AT as patterned for each pixel, but the disclosure is not limited thereto. In an embodiment, anode electrodes may be formed as a single body.

The light emitting layer EML may be disposed on the anode electrode AT. The light emitting layer EML may be disposed in a region corresponding to the opening OP. For example, the light emitting layer EML may be separately formed on each of pixels. In case that the light emitting layer EML is individually formed in each of the pixels, each of the light emitting layers EML may emit light of blue, red, or green. However, the disclosure is not limited thereto, and the light emitting layer EML may be commonly provided. The light emitting layer EML may emit blue light or white light.

The cathode electrode CT may be disposed on the light emitting layer EML. The cathode electrode CT may be commonly disposed in pixels.

The first common layer HL may be disposed between the anode electrode AT and the light emitting layer EML. The first common layer HL may include at least one of a hole injection layer, a hole transport layer, and an electron blocking layer. In an embodiment, the first common layer HL may be disposed in the opening OP. However, the disclosure is not limited thereto, and the first common layer HL may be formed overlapping multiple pixels.

The second common layer EL may be disposed between the light emitting layer EML and the cathode electrode CT. The second common layer EL may include at least one of an electron injection layer, an electron transport layer, and a hole blocking layer.

FIG. 4A illustrate the first red light emitting element ED_R1 disposed in the first-first region AA1-1, but the description the first red light emitting element ED_R1 may be equally applied to the light emitting elements ED_R, ED_G, and ED_B included in the first light emitting element group EG1.

In the display panel DP of the disclosure, the first driving circuit DC1 and the second driving circuit DC2 may be disposed in a display region, so that the area of a peripheral region may be reduced. Since the first driving circuit DC1 and the second driving circuit DC2 are disposed between the pixel circuits PC, the light emitting element ED disposed on the first driving circuit DC1 and the second driving circuit DC2 may have a reduced distance to a corresponding pixel circuit PC, and display quality may be improved due to improved connection reliability.

However, the display panel DP of the disclosure is not limited thereto.

FIG. 3B and FIG. 4A illustrates a structure in which one light emitting element unit EDU is connected to one pixel circuit unit PCU. However, the disclosure is not limited thereto. In an embodiment, two or more light emitting element units EDU may be connected to one pixel circuit unit PCU.

Figure 4B:
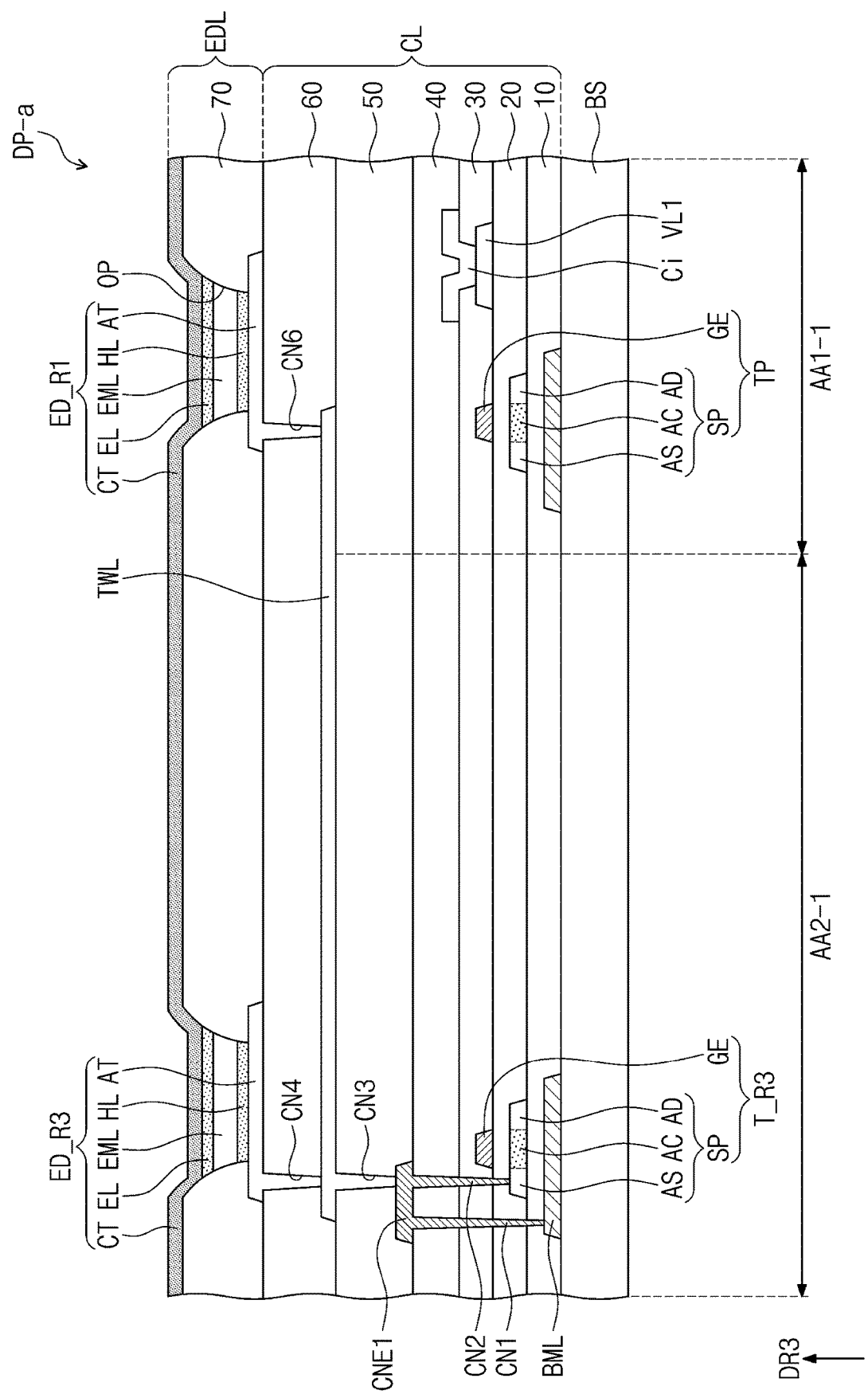
FIG. 4B is a schematic cross-sectional view of a display panel according to an embodiment of the disclosure.

FIG. 4B is a schematic cross-sectional view of a display panel according to an embodiment of the disclosure. Among components illustrated in FIG. 4B, the same descriptions are applied to components described above with reference to FIG. 4A, and detailed descriptions thereof will be omitted.

According to an embodiment, in a display panel DP-a of FIG. 4B, two light emitting elements (i.e., the first and third red light emitting elements ED_R3 and ED_R1) may be connected to one first pixel transistor (i.e., the third red pixel transistor T_R3). For example, the third red pixel transistor T_R3 may be connected to the anode electrode AT of the third red light emitting element ED_R3 through the first connection electrode CNE1 and the connection line TWL. The third red pixel transistor T_R3 may be connected to the anode electrode AT of the first red light emitting element ED_R1 through the first connection electrode CNE1 and the connection line TWL. For example, using the connection line TWL, the third red pixel transistor T_R3 disposed in the second-first region AA2-1 may drive the third red light emitting element ED_R3 disposed in the second-first region AA2-1 and the first red light emitting element ED_R1 disposed in the first-first region AA1-1. Accordingly, the first red pixel transistor T_R1 described above with reference to FIG. 4A may be omitted.

Figure 5:
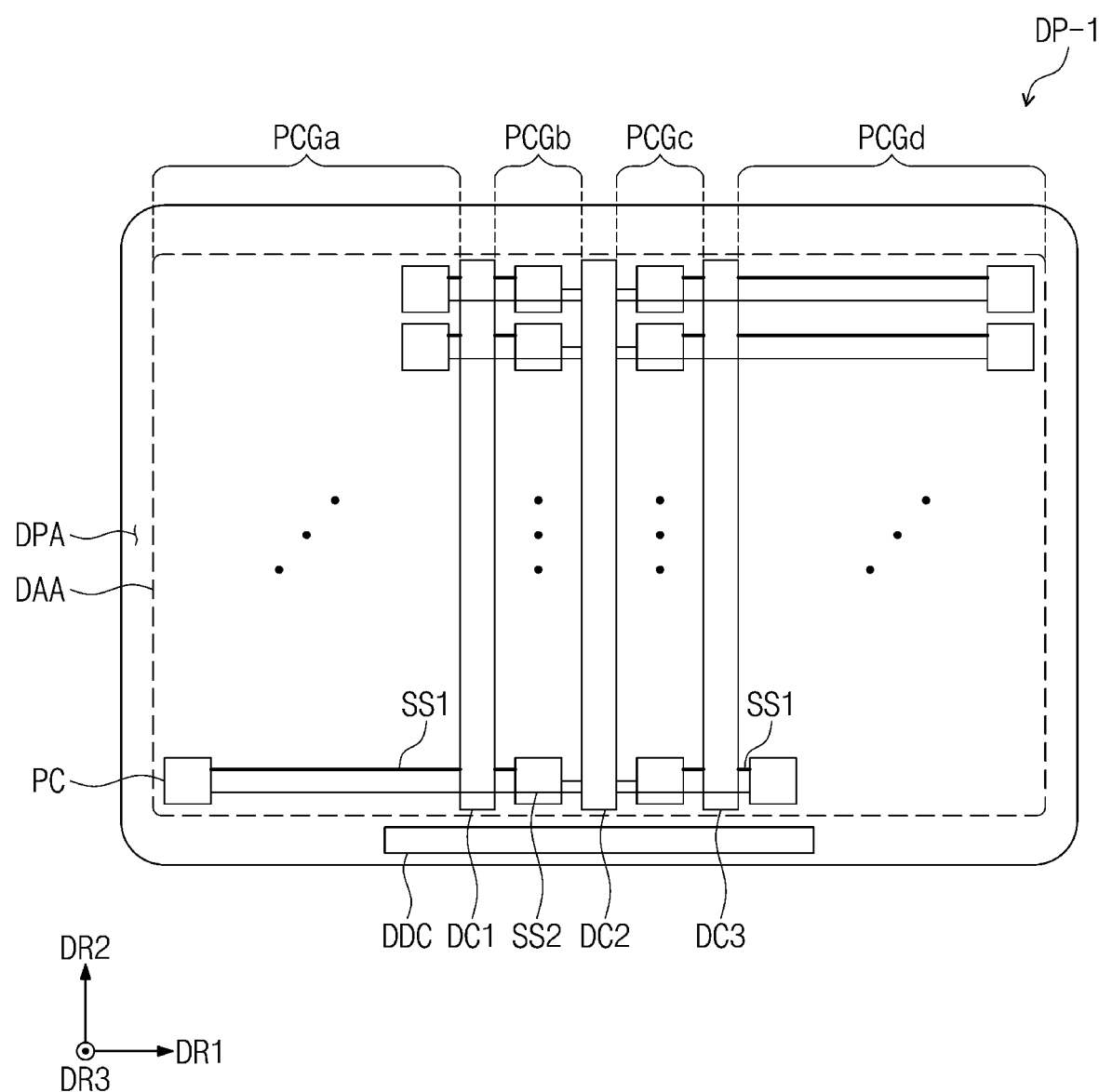
FIG. 5 is a plan view schematically illustrating a display panel according to an embodiment of the disclosure.

FIG. 5 is a plan view schematically illustrating a display panel according to an embodiment of the disclosure.

Referring to FIG. 5, according to an embodiment, a display panel DP-1 may further include a third driving circuit DC3 compared to the display panel DP described above with reference to FIG. 2. In an embodiment, the third driving circuit DC3 may be spaced apart from the first driving circuit DC1 and the second driving circuit DC2. The second driving circuit DC2 may be interposed between the first driving circuit DC1 and the third driving circuit DC3 in the first direction DR1. In the first direction DR1, the first to third driving circuits DC1, DC2, and DC3 may be spaced apart from each other with the pixel circuits PC interposed therebetween.

In an embodiment, the first and third driving circuits DC1 and DC3 may be same. In an embodiment, the second driving circuit DC2 may be different from the first and third driving circuits DC1 and DC3. In an embodiment, the first and third driving circuits DC1 and DC3 may be scan driving circuits which provide scan signals to the pixel circuits PC, and the second driving circuit DC2 may be an emission control driving circuit which provides emission driving signals to the pixel circuits PC. In another embodiment, the first and third driving circuits DC1 and DC3 may be emission control driving circuits which provide emission driving signals to the pixel circuits PC, and the second driving circuit DC2 may be a scan driving circuit which provides scan signals to the pixel circuits PC.

The pixel circuits PC may be divided into multiple groups according to regions in which the pixel circuits PC are disposed. For example, the pixel circuits PC may be divided into a first pixel circuit group PCGa disposed on the left side of the first driving circuit DC1, a second pixel circuit group PCGb disposed between the first driving circuit DC1 and the second driving circuit DC2, a third pixel circuit group PCGc disposed between the second driving circuit DC2 and the third driving circuit DC3, and a fourth pixel circuit group PCGd disposed on the right side of the third driving circuit DC3 in a plan view. For example, the first pixel circuit group PCGa and the second pixel circuit group PCGb may be spaced apart from each other in the first direction DR1 with the first driving circuit DC1 interposed therebetween. For example, the second pixel circuit group PCGb and the third pixel circuit group PCGc may be spaced apart from each other in the first direction DR1 with the second driving circuit DC2 interposed therebetween. For example, the third pixel circuit group PCGc and the fourth pixel circuit group PCGd may be spaced apart from each other in the first direction DR1 with the third driving circuit DC3 interposed therebetween.

Each of the pixel circuits PC may be connected to closer one of the first and third driving circuits DC1 and DC3 and to the second driving circuit DC2 to receive a signal. For example, the first driving circuit DC1 may provide the first signal SS1 to pixel circuits PC included in the first and second pixel circuit groups PCGa and PCGb, the third driving circuit DC3 may provide the first signal SS1 to pixel circuits PC included in the third and fourth pixel circuit groups PCGc and PCGd, and the second driving circuit DC2 may provide the second signal SS2 to pixel circuits PC included in the first to fourth pixel circuit groups PCGa, PCGb, PCGc, and PCGd. The first signal SS1 may be one of a scan signal and an emission driving signal, and the second signal SS2 may be another one of the scan signal and the emission driving signal.

The description of a first light emitting element ED_R described above with reference to FIG. 3B and FIG. 4A may be equally applied to light emitting elements disposed overlapping the first to third driving circuits DC1, DC2, and DC3. For example, the light emitting elements disposed overlapping the first to third driving circuits DC1, DC2, and DC3 may be connected to an adjacent pixel circuit PC through the connection line TWL (see FIG. 4A).

However, the disclosure is not limited thereto. In an embodiment, the second pixel circuit group PCGb may be disposed between the first pixel circuit group PCGa and the first driving circuit DC1, and the first and second driving circuits DC1 and DC2 may be disposed adjacent to each other. In another embodiment, the third pixel circuit group PCGc may be disposed between the fourth pixel circuit group PCGd and the third driving circuit DC3, and the second and third driving circuits DC2 and DC3 may be disposed adjacent to each other.

Figure 6:
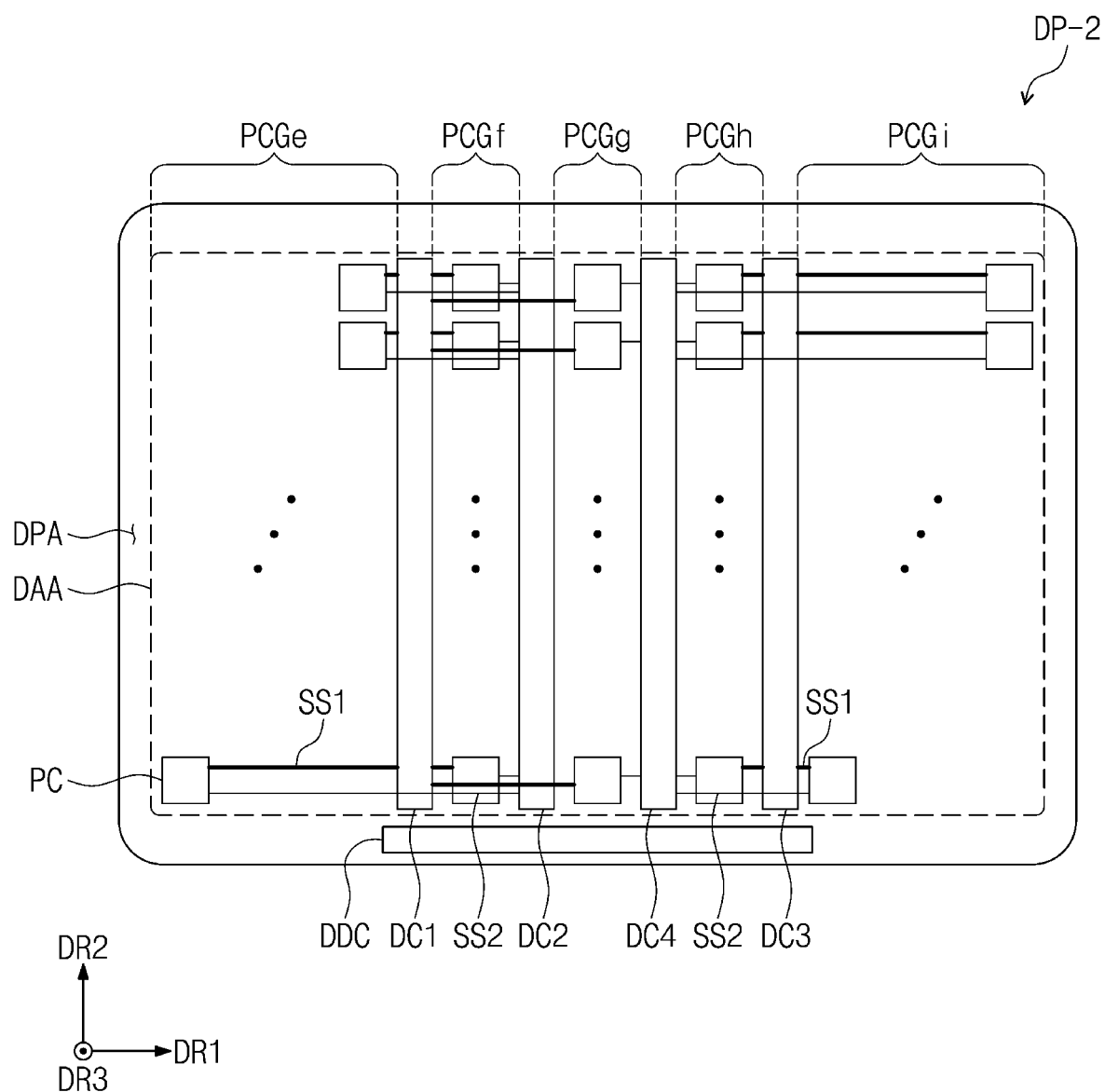
FIG. 6 is a plan view schematically illustrating a display panel according to an embodiment of the disclosure.

FIG. 6 is a plan view schematically illustrating a display panel according to an embodiment of the disclosure.

Referring to FIG. 6, according to an embodiment, a display panel DP-2 may further include a fourth driving circuit DC4 compared to the display panel DP-1 described above with reference to FIG. 5. In an embodiment, the fourth driving circuit DC4 may be disposed between second driving circuit DC2 and the third driving circuit DC3 in the first direction DR1.

In the first direction DR1, the first to fourth driving circuits DC1, DC2, DC3, and DC4 may be spaced apart from each other with the pixel circuits PC interposed therebetween.

In an embodiment, the first and third driving circuits DC1 and DC3 may be same, and the second and fourth driving circuits DC2 and DC4 may be same. For example, the first and third driving circuits DC1 and DC3 may be different from the second and fourth driving circuits DC2 and DC4. In an embodiment, the first and third driving circuits DC1 and DC3 may be scan driving circuits which provide scan signals to the pixel circuits PC, and the second and fourth driving circuits DC2 and DC4 may be emission control driving circuits which provide emission driving signals to the pixel circuits PC. In another example, the first and third driving circuits DC1 and DC3 may be emission control driving circuits which provide emission driving signals to the pixel circuits PC, and the second and fourth driving circuits DC2 and DC4 may be scan driving circuits which provide scan signals to the pixel circuits PC.

The pixel circuits PC may be divided into multiple groups according to regions in which the pixel circuits PC are disposed. For example, the pixel circuits PC may be divided into a first pixel circuit group PCGe disposed on the left side of the first driving circuit DC1, a second pixel circuit group PCGf disposed between the first driving circuit DC1 and the second driving circuit DC2, a third pixel circuit group PCGg disposed between the second driving circuit DC2 and the fourth driving circuit DC4, and a fourth pixel circuit group PCGh disposed between the fourth driving circuit DC4 and the third driving circuit DC3, and a fifth pixel circuit group PCGi disposed on the right side of the third driving circuit DC3 in a plan view. For example, the first pixel circuit group PCGe and the second pixel circuit group PCGf may be spaced apart from each other in the first direction DR1 with the first driving circuit DC1 interposed therebetween. For example, the second pixel circuit group PCGf and the third pixel circuit group PCGg may be spaced apart from each other in the first direction DR1 with the second driving circuit DC2 interposed therebetween. For example, the third pixel circuit group PCGg and the fourth pixel circuit group PCGh may be spaced apart from each other in the first direction DR1 with the fourth driving circuit DC4 interposed therebetween. For example, the fourth pixel circuit group PCGh and the fifth pixel circuit group PCGi may be spaced apart from each other in the first direction DR1 with the third driving circuit DC3 interposed therebetween.

Each of the pixel circuits PC may be connected to closer one of the first and third driving circuits DC1 and DC3 and to closer one of the second and fourth driving circuits DC2 and DC4 to receive a signal. For example, the first driving circuit DC1 may provide the first signal SS1 to the pixel circuits PC included in the first and second pixel circuit groups PCGe and PCGf and to the pixel circuits PC closer to the first driving circuit DC1 of the third pixel circuit group PCGg, and the third driving circuit DC3 may provide the first signal SS1 to the pixel circuits PC included in the fourth and fifth pixel circuit groups PCGh and PCGi and to the pixel circuits PC closer to the third driving circuit DC3 of the third pixel circuit group PCGg. Distances from the pixel circuits PC included in the third pixel circuit group PCGg illustrated in FIG. 6 to the first driving circuit DC1 and to the third driving circuit DC3 are same, and thus, are illustrated as receiving the first signal SS1 from the first driving circuit DC1. However, the disclosure is not limited thereto, and the pixel circuits PC included in the third pixel circuit group PCGg may receive the first signal SS1 from the third driving circuit DC3. In another embodiment, in case that two or more of the pixel circuits PC included in the third pixel circuit group PCGg are arranged in the first direction DR1, each of the pixel circuits PC may receive the first signal SS1 from closer one of the first driving circuit DC1 and the third driving circuit DC3.

The second driving circuit DC2 may provide the second signal SS2 to the pixel circuits PC included in the first and second pixel circuit groups PCGe and PCGf and to the pixel circuits PC closer to the first driving circuit DC1 of the third pixel circuit group PCGg, and the fourth driving circuit DC4 may provide the second signal SS2 to the pixel circuits PC included in the fourth and fifth pixel circuit groups PCGh and PCGi and to the pixel circuits PC closer to the fourth driving circuit DC4 of the third pixel circuit group PCGg. Distances from the pixel circuits PC included in the third pixel circuit group PCGg illustrated in FIG. 6 to the second driving circuit DC2 and to the fourth driving circuit DC4 are same, and thus, are illustrated as receiving the second signal SS2 from the fourth driving circuit DC4. However, the disclosure is not limited thereto, and the pixel circuits PC included in the third pixel circuit group PCGg may receive the second signal SS2 from the second driving circuit DC2. In another embodiment, in case that two or more of the pixel circuits PC included in the third pixel circuit group PCGg are arranged in the first direction DR1, each of the pixel circuits PC may receive the second signal SS2 from closer one of the second driving circuit DC2 and the fourth driving circuit DC4.

The first signal SS1 may be one of a scan signal and an emission driving signal, and the second signal SS2 may be another one of the scan signal and the emission driving signal.

The description of the first light emitting element ED_R described above with reference to FIG. 3B and FIG. 4A may be equally applied to light emitting elements disposed overlapping the first to fourth driving circuits DC1, DC2, DC3, and DC4. For example, the light emitting elements disposed overlapping the first to fourth driving circuits DC1, DC2, DC3, and DC4 may be connected to an adjacent pixel circuit PC through the connection line TWL (see FIG. 4A).

However, disclosure is not limited thereto. In an embodiment, the second pixel circuit group PCGf may be disposed between the first pixel circuit group PCGe and the first driving circuit DC1, and the first and second driving circuits DC1 and DC2 may be disposed adjacent to each other. In another embodiment, the third pixel circuit group PCGg may be disposed between the second pixel circuit group PCGf and the third driving circuit DC3, and the second and fourth driving circuits DC2 and DC4 may be disposed adjacent to each other. In another embodiment, the fourth group PCGh may be disposed between the third driving circuit DC3 and the fifth pixel circuit group PCGi, and the third and fourth driving circuits DC3 and DC3 may be disposed adjacent to each other.

FIG. 5 and FIG. 6 illustrate that the display device include three or four driving circuits. However, disclosure is not limited thereto, and the display device may include five driving circuits.

Referring to FIG. 5 and FIG. 6, the display panels DP-1 and DP-2 of the disclosure provide two or more driving circuits which provide a same signal, and thus, may reduce load applied to the output of the driving circuits. Since the pixel circuit PC is connected to the closest driving circuit between the two driving circuits, the length of a connection line between the pixel circuit PC and a driving circuit may be reduced, and noise generated in signal transmission may be reduced.

In the display panels DP, DP-1, and DP-2 of the disclosure, the first driving circuit DC1 and the second driving circuit DC2 may be disposed in a display region, so that the area of a peripheral region may be reduced, and the display region may be increased. Since the first driving circuit DC1 and the second driving circuit DC2 are disposed between the pixel circuits PC, a light emitting element disposed on the first driving circuit DC1 and the second driving circuit DC2 may have a reduced distance to a corresponding pixel circuit PC, and display quality may be improved due to improved connection reliability. The light emitting element ED disposed on the outer periphery of the display region DAA may also have a reduced distance to the pixel circuit PC, so that connection reliability may be improved and image quality may be improved. Therefore, the display panels DP, DP-1, and DP-2 with a narrow bezel may stably provide high display quality.

A display panel of an embodiment may have an expanded display region, and the display quality of the display region may be improved.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display panel comprising:
a base layer;
a circuit layer disposed on the base layer and including a first driving circuit, a second driving circuit, a third driving circuit, and a plurality of pixel circuits; and
a light emitting element layer disposed on the circuit layer and including a plurality of light emitting elements, each of the plurality of light emitting elements electrically connected to corresponding one of the plurality of pixel circuits,
wherein each of the first driving circuit, the second driving circuit, and the third driving circuit is disposed between the plurality of pixel circuits in a first direction,
at least one of the plurality of pixel circuits is connected to two adjacent light emitting elements of the plurality of light emitting elements,
one of the two adjacent light emitting elements overlaps one of the first driving circuit and the second driving circuit in a plan view, and the other one of the two adjacent light emitting elements overlaps the plurality of pixel circuits in a plan view.

2. The display panel of claim 1, wherein
the circuit layer comprises:
an insulation layer;
a semiconductor pattern;
a conductive pattern; and
a signal line.

3. The display panel of claim 1, wherein the plurality of light emitting elements include a first light emitting element group overlapping the first driving circuit and the second driving circuit in a plan view and a second light emitting element group overlapping the plurality of pixel circuits in a plan view.

4. The display panel of claim 3, wherein each of the plurality of light emitting elements in the first light emitting element group is electrically connected to adjacent one of the plurality of pixel circuits through a connection line.

5. The display panel of claim 4, wherein
each of the plurality of light emitting elements in the first light emitting element group comprises:
a first electrode disposed on the circuit layer;
a light emitting layer disposed on the first electrode; and
a second electrode disposed on the light emitting layer, and
the first electrode is electrically connected to the connection line.

6. The display panel of claim 1, wherein each of the plurality of pixel circuits is electrically connected to the first driving circuit and the second driving circuit.

7. The display panel of claim 1, wherein
the circuit layer further includes a third driving circuit spaced apart from the first driving circuit and the second driving circuit, and
the second driving circuit is interposed between the first driving circuit and the third driving circuit in the first direction.

8. The display panel of claim 7, wherein each of the plurality of pixel circuits is electrically connected to the second driving circuit and a closer one of the first driving circuit and the third driving circuit.

9. The display panel of claim 7, wherein
the plurality of light emitting elements include a first light emitting element group overlapping the first driving circuit, the second driving circuit, and the third driving circuit in a plan view and a second light emitting element group overlapping the plurality of pixel circuits in a plan view, and
each of the plurality of light emitting elements in the first light emitting element group is electrically connected to an adjacent one of the plurality of pixel circuits through a connection line.

10. The display panel of claim 7, wherein the circuit layer further includes a fourth driving circuit disposed between the second driving circuit and the third driving circuit in the first direction.

11. The display panel of claim 10, wherein each of the plurality of pixel circuits is electrically connected to closer one of the first driving circuit and the third driving circuit and to a closer one of the second driving circuit and the fourth driving circuit.

12. The display panel of claim 10, wherein
the plurality of light emitting elements include a first light emitting element group overlapping the first driving circuit, the second driving circuit, the third driving circuit, and the fourth driving circuit in a plan view and a second light emitting element group overlapping the plurality of pixel circuits in a plan view, and
each of the plurality of light emitting elements in the first light emitting element group is electrically connected to an adjacent one of the plurality of pixel circuits through a connection line.

13. The display panel of claim 1, wherein each of the first driving circuit and the second driving circuit extends in a second direction intersecting the first direction, the display panel further comprising a data driving circuit that extends in the second direction and is disposed below the first driving circuit and the second driving circuit.

14. An electronic device comprising:
   a base layer including a display region and a non-display region disposed adjacent to the display region;
   a circuit layer disposed on the base layer and including:
      a first driving circuit disposed in the display region;
      a second driving circuit spaced apart from the first driving circuit in a first direction; and
      a plurality of pixel circuits; and
   a light emitting element layer disposed on the circuit layer and including a plurality of light emitting elements disposed in the display region, each of the plurality of light emitting elements electrically connected to corresponding one of the plurality of pixel circuits,
   wherein in the first direction, at least one of the plurality of pixel circuits is disposed between the first driving circuit and the second driving circuit,
   at least one of the plurality of pixel circuits is connected to two adjacent light emitting elements of the plurality of light emitting elements,
   one of the two adjacent light emitting elements overlaps one of the first driving circuit and the second driving circuit in a plan view, and the other one of the two adjacent light emitting elements overlaps the plurality of pixel circuits in a plan view.

15. The electronic device of claim 14, wherein each of the plurality of pixel circuits is electrically connected to the first driving circuit and the second driving circuit.

16. The electronic device of claim 14, wherein
   the plurality of light emitting elements include a first light emitting element group overlapping the first driving circuit and the second driving circuit in a plan view and a second light emitting element group overlapping the plurality of pixel circuits in a plan view, and
   each of the plurality of light emitting elements in the first light emitting element group is electrically connected to an adjacent one of the plurality of pixel circuits through a connection line.

17. The electronic device of claim 14, wherein
   the circuit layer further includes a third driving circuit spaced apart from the first driving circuit and the second driving circuit,
   the second driving circuit is interposed between the first driving circuit and the third driving circuit in the first direction, and
   each of the plurality of pixel circuits is electrically connected to the second driving circuit and a closer one of the first driving circuit and the third driving circuit.

18. The electronic device of claim 17, wherein
   the plurality of light emitting elements include a first light emitting element group overlapping the first driving circuit, the second driving circuit, and the third driving circuit in a plan view and a second light emitting element group overlapping the plurality of pixel circuits in a plan view, and
   each of the plurality of light emitting elements in the first light emitting element group is electrically connected to an adjacent one of the plurality of pixel circuits through a connection line.

19. The electronic device of claim 17, wherein
   the circuit layer further includes a fourth driving circuit disposed between the second driving circuit and the third driving circuit in the first direction, and
   each of the plurality of pixel circuits is electrically connected to a closer one of the first driving circuit and the third driving circuit and to a closer one of the second driving circuit and the fourth driving circuit.

20. The electronic device of claim 19, wherein
   the plurality of light emitting elements include a first light emitting element group overlapping the first driving circuit, the second driving circuit, the third driving circuit, and the fourth driving circuit in a plan view and a second light emitting element group overlapping the plurality of pixel circuits in a plan view, and
   each of the plurality of light emitting elements in the first light emitting element group is electrically connected to an adjacent one of the plurality of pixel circuits through a connection line.

* * * * *